(12) United States Patent
Kamada et al.

(10) Patent No.: US 12,046,838 B2
(45) Date of Patent: Jul. 23, 2024

(54) MULTILAYER BOARD

(71) Applicant: Murata Manufacturing Co., Ltd., Nagaokakyo (JP)

(72) Inventors: Koji Kamada, Nagaokakyo (JP); Kunihiro Komaki, Nagaokakyo (JP); Masahiro Izawa, Nagaokakyo (JP); Ryo Komura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 139 days.

(21) Appl. No.: 17/901,018

(22) Filed: Sep. 1, 2022

(65) Prior Publication Data
US 2022/0416425 A1    Dec. 29, 2022

Related U.S. Application Data

(63) Continuation of application No. PCT/JP2021/009016, filed on Mar. 8, 2021.

(30) Foreign Application Priority Data

Apr. 14, 2020 (JP) .................. 2020-072089
Sep. 10, 2020 (JP) .................. 2020-151833

(51) Int. Cl.
*H01Q 9/04* (2006.01)
*H01Q 1/48* (2006.01)
*H05K 1/16* (2006.01)

(52) U.S. Cl.
CPC ............ *H01Q 9/0407* (2013.01); *H01Q 1/48* (2013.01); *H05K 1/162* (2013.01); *H05K 2201/09672* (2013.01); *H05K 2201/10098* (2013.01)

(58) Field of Classification Search
CPC ........ H01Q 9/0407; H01Q 9/0414; H01Q 1/48
See application file for complete search history.

(56) References Cited

U.S. PATENT DOCUMENTS 7,839,350 B2 * 11/2010 Nagai ................... H01Q 9/045
                                                       343/851
11,056,793 B2 * 7/2021 Hara ...................... H01Q 1/48
(Continued)

FOREIGN PATENT DOCUMENTS

JP    2001111329 A    4/2001
JP    2003332830 A    11/2003
(Continued)

OTHER PUBLICATIONS

International Search Report in PCT/JP2021/009016, mailed May 18, 2021, 3 pages.
(Continued)

*Primary Examiner* — Awat M Salih
(74) *Attorney, Agent, or Firm* — Keating & Bennett, LLP

(57) ABSTRACT

An element assembly has a structure in which insulator layers including first and second insulator layers are laminated in an up-down direction. The first insulator layer is above the second insulator layer. A radiant conductor layer is on an upper surface of the first insulator layer. A first capacitance defining portion includes a first interlayer connection conductor passing through one or more of the insulator layers in the up-down direction. The first interlayer connection conductor is electrically connected to the radiant conductor layer. The radiant conductor layer, a ground conductor, and the first capacitance defining portion define and function as a patch antenna. When the first interlayer connection conductor is electrically connected to the radiant conductor layer, a distance from a lower end of the first interlayer connection conductor to the ground conductor in
(Continued)

the up-down direction is shorter than a distance from the radiant conductor layer to the ground conductor in the up-down direction.

20 Claims, 13 Drawing Sheets

(56) References Cited

U.S. PATENT DOCUMENTS

| | | |
|---|---|---|
| 2009/0046029 A1 | 2/2009 | Nagai |
| 2012/0256796 A1* | 10/2012 | Leiba ............... H01Q 9/38 |
| | | 343/781 R |
| 2014/0354411 A1* | 12/2014 | Pudenz ............. H01Q 9/0407 |
| | | 343/700 MS |
| 2016/0056544 A1* | 2/2016 | Garcia ............... H01Q 9/0407 |
| | | 343/725 |
| 2018/0145391 A1* | 5/2018 | Gouchi ............... H05K 3/365 |
| 2019/0379134 A1* | 12/2019 | Paulotto ............ H01Q 21/062 |

FOREIGN PATENT DOCUMENTS

| | | | |
|---|---|---|---|
| JP | 2008236362 A | | 10/2008 |
| JP | 2010056718 A | | 3/2010 |
| KR | 20200112581 | * | 6/2019 |
| WO | 2007069366 A1 | | 6/2007 |

OTHER PUBLICATIONS

Written Opinion in PCT/JP2021/009016, mailed May 18, 2021, 4 pages.

* cited by examiner

Fig.4
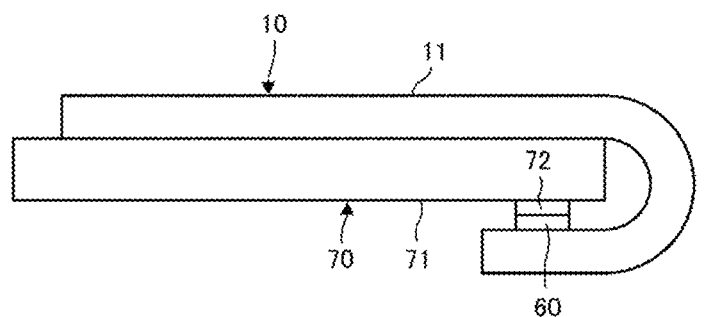
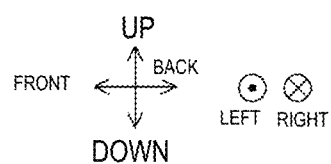

Fig.6
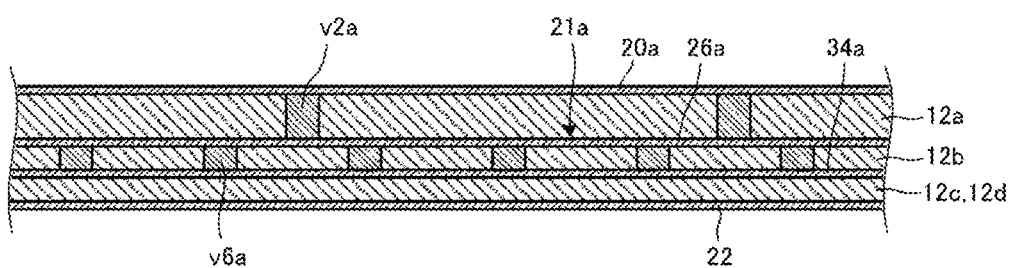
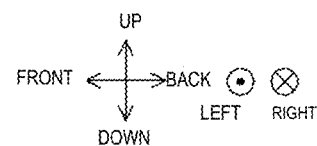

Fig.10
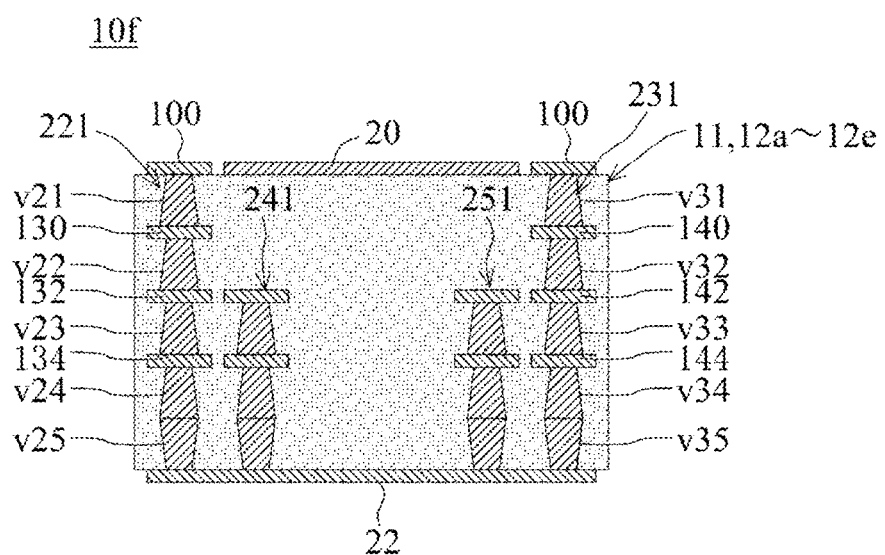
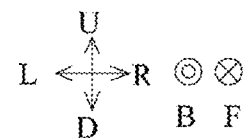

Fig.11
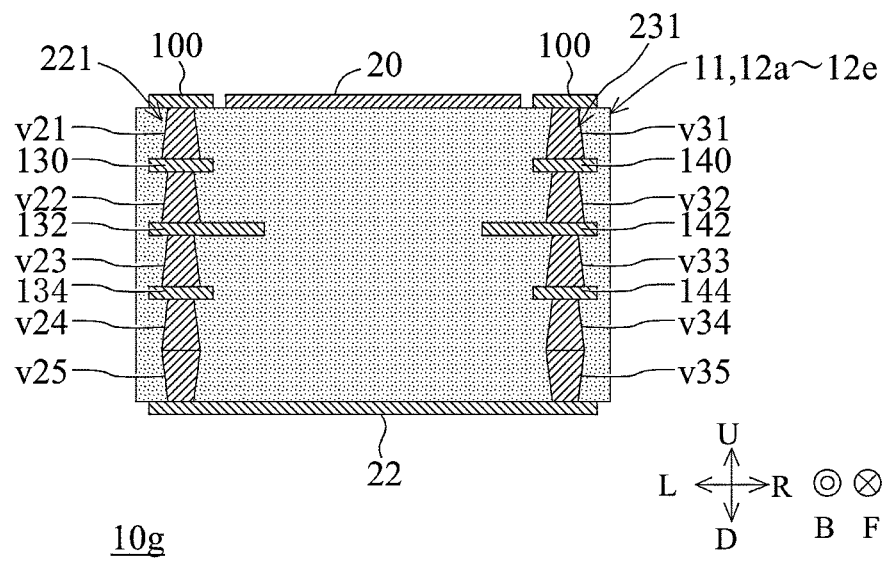
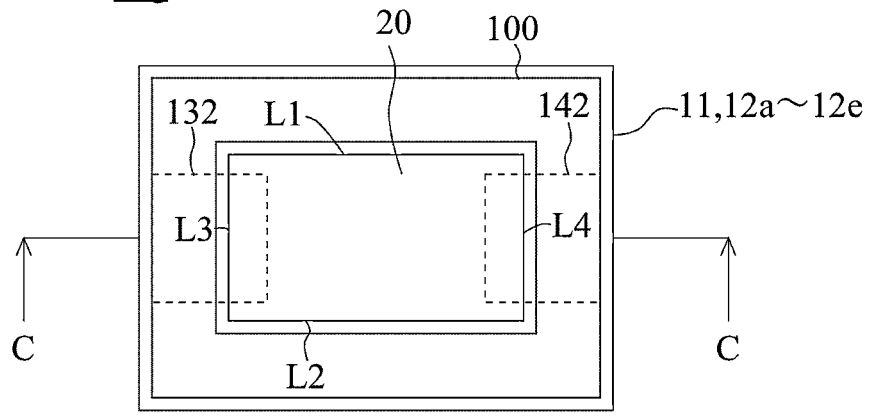
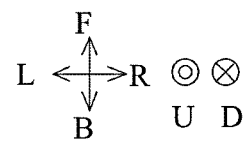

Fig.13
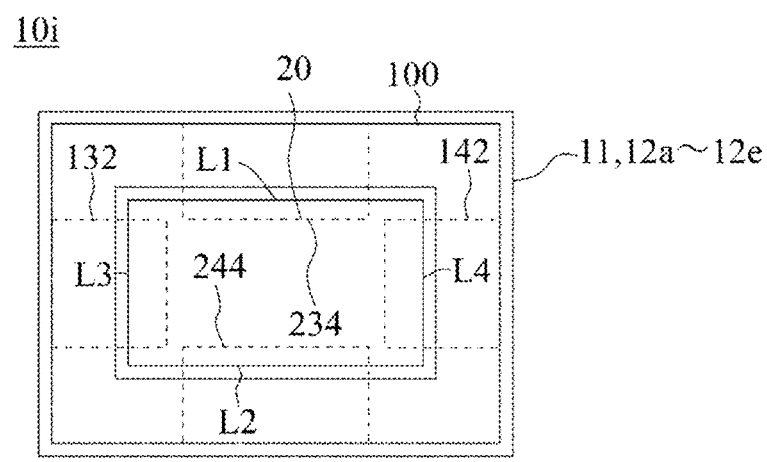
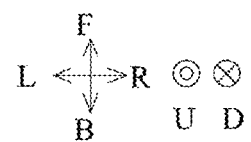

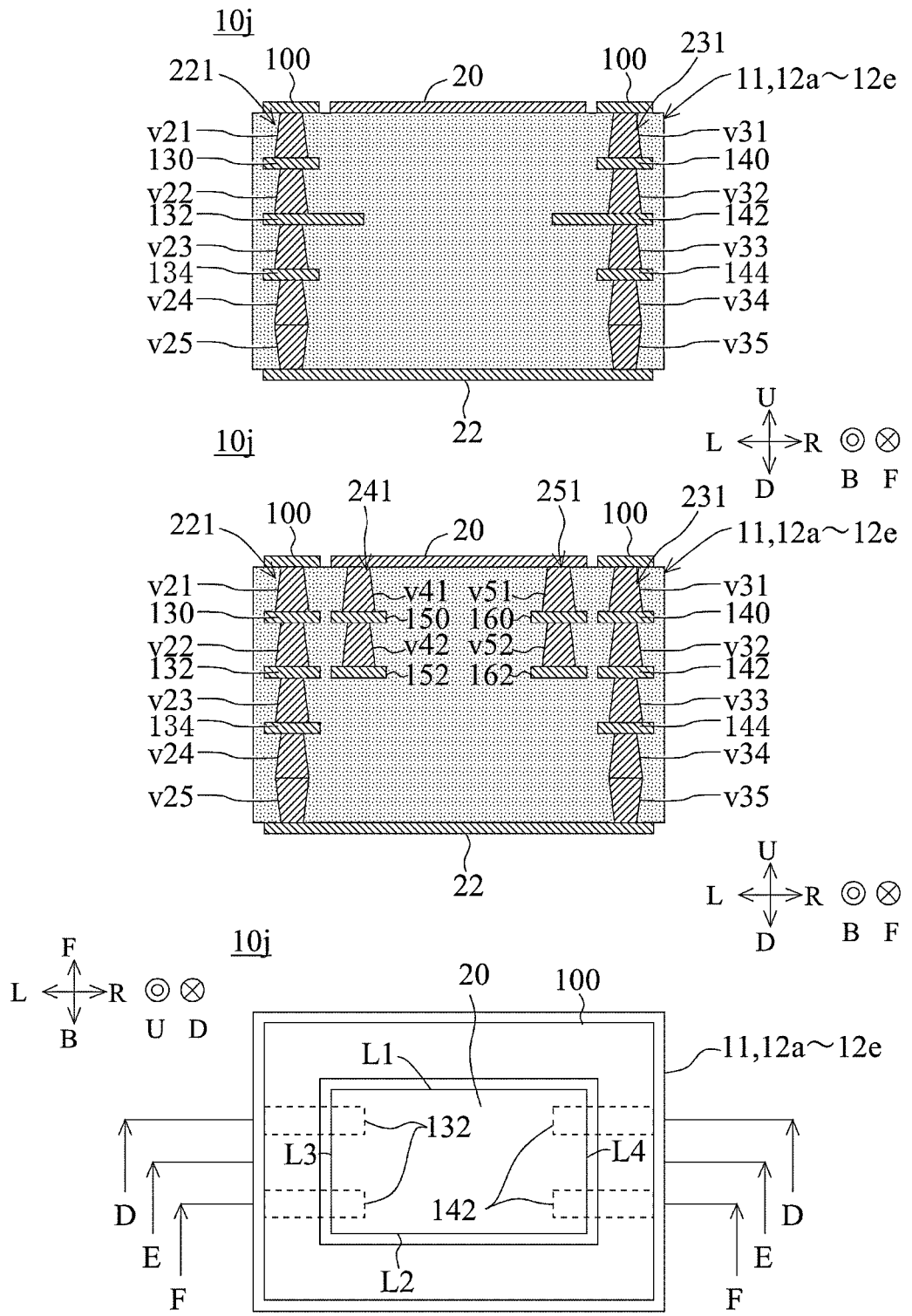

MULTILAYER BOARD

CROSS REFERENCE TO RELATED APPLICATIONS

This application claims the benefit of priority to Japanese Patent Application No. 2020-151833 filed Sep. 10, 2020 and Japanese Patent Application No. 2020-072089 filed on Apr. 14, 2020, and is a Continuation Application of PCT Application No. PCT/JP2021/009016 filed on Mar. 8, 2021. The entire contents of each application are hereby incorporated herein by reference.

BACKGROUND OF THE INVENTION

1. Field of the Invention

The present invention relates to a multilayer board including a patch antenna.

2. Description of the Related Art

As an invention regarding a conventional multilayer board including a patch antenna, for example, a patch antenna described in Japanese Unexamined Patent Application Publication No. 2008-236362 has been known. The patch antenna described in Japanese Unexamined Patent Application Publication No. 2008-236362 includes a radiant electrode in a substantially rectangular shape. The radiant electrode includes a slit-shaped notched part. According to the patch antenna described in Japanese Unexamined Patent Application Publication No. 2008-236362, as described below, a reduction in the size of the patch antenna and a decrease in resonant frequency are both achieved.

The resonant frequency of the patch antenna depends on the length of the outer edge of the radiant electrode. Thus, if the size of the radiant electrode is reduced in order to reduce the size of the patch antenna, the outer edge of the radiant electrode is shortened. As a result, the resonant frequency of the patch antenna is increased. In this manner, a reduction in the size of the patch antenna and a decrease in resonant frequency have a trade-off relation.

Hence, in the patch antenna described in Japanese Unexamined Patent Application Publication No. 2008-236362, the radiant electrode has a slit-shaped notched part. With this, the outer edge of the radiant electrode is elongated. As a result, the resonant frequency of the patch antenna can be decreased.

SUMMARY OF THE INVENTION

Meanwhile, it is desired that a resonant frequency of a patch antenna in a multilayer board be decreased more.

Preferred embodiments of the present invention provide multilayer boards each capable of achieving a decrease in resonant frequency of a patch antenna.

A multilayer board according to one aspect of a preferred embodiment of the present invention includes an element assembly, a radiant conductor layer, and a first capacitance defining portion, wherein the element assembly has a structure in which a plurality of insulator layers including a first insulator layer and a second insulator layer are laminated in an up-down direction, one of an upward direction and a downward direction is defined as a first direction and another one of the upward direction and the downward direction is defined as a second direction, the first insulator layer is arranged in the first direction of the second insulator layer, the radiant conductor layer is provided on an upper surface or a lower surface of the first insulator layer, the first capacitance defining portion includes a first interlayer connection conductor passing through one or more insulator layer among the plurality of insulator layers in the up-down direction, the first interlayer connection conductor is electrically connected to the radiant conductor layer, a ground conductor is arranged in the second direction of the radiant conductor layer, the radiant conductor layer, the ground conductor, and the first capacitance defining portion define and function as a patch antenna, a distance from an end of the first interlayer connection conductor in the second direction to the ground conductor in the up-down direction is shorter than a distance from the radiant conductor layer to the ground conductor in the up-down direction, and the multilayer board includes a structure (A) or (B).

(A) The multilayer board further includes the ground conductor provided on an upper surface or a lower surface of the second insulator layer so as to overlap the radiant conductor layer when viewed in the up-down direction, the ground conductor being not electrically connected to the radiant conductor layer.

(B) The ground conductor is provided outside the multilayer board so as to overlap the radiant conductor layer when viewed in the up-down direction.

A multilayer board according to one aspect of a preferred embodiment of the present invention includes an element assembly, a radiant conductor layer, and a first capacitance defining portion, wherein the element assembly has a structure in which a plurality of insulator layers including a first insulator layer and a second insulator layer are laminated in an up-down direction, one of an upward direction and a downward direction is defined as a first direction and another one of the upward direction and the downward direction is defined as a second direction, the first insulator layer is arranged in the first direction of the second insulator layer, the radiant conductor layer is provided on an upper surface or a lower surface of the first insulator layer, the first capacitance defining portion includes a first interlayer connection conductor extending through one or more insulator layer among the plurality of insulator layers in the up-down direction, the first interlayer connection conductor is electrically connected to a ground conductor arranged in the second direction of the radiant conductor layer, the radiant conductor layer, the ground conductor, and the first capacitance defining portion define and function as a patch antenna, a distance from an end of the first interlayer connection conductor in the first direction to the ground conductor in the up-down direction is shorter than a distance from the radiant conductor layer to the ground conductor in the up-down direction, and the multilayer board includes a structure (A) or (B).

(A) The multilayer board further includes the ground conductor provided on an upper surface or a lower surface of the second insulator layer so as to overlap the radiant conductor layer when viewed in the up-down direction, the ground conductor being not electrically connected to the radiant conductor layer.

(B) The ground conductor is provided outside the multilayer board so as to overlap the radiant conductor layer when viewed in the up-down direction.

According to the multilayer boards of preferred embodiments of the present invention, the resonant frequency of the patch antenna can be lowered.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a diagram depicting an example of use of the multilayer board 10.

FIG. 6 is a sectional view of a multilayer board 10b according to Modification 2.

FIG. 10 depicts a sectional view of a multilayer board 10f according to Modification 6.

FIG. 11 depicts a sectional view and a top view of a multilayer board 10g according to Modification 7.

FIG. 13 is a top view of a multilayer board 10i according to Modification 9.

FIG. 14 depicts sectional views and a top view of a multilayer board 10j according to Modification 10.

DETAILED DESCRIPTION OF THE PREFERRED EMBODIMENTS

Preferred Embodiments

Structure of Multilayer Board

Figure 1:
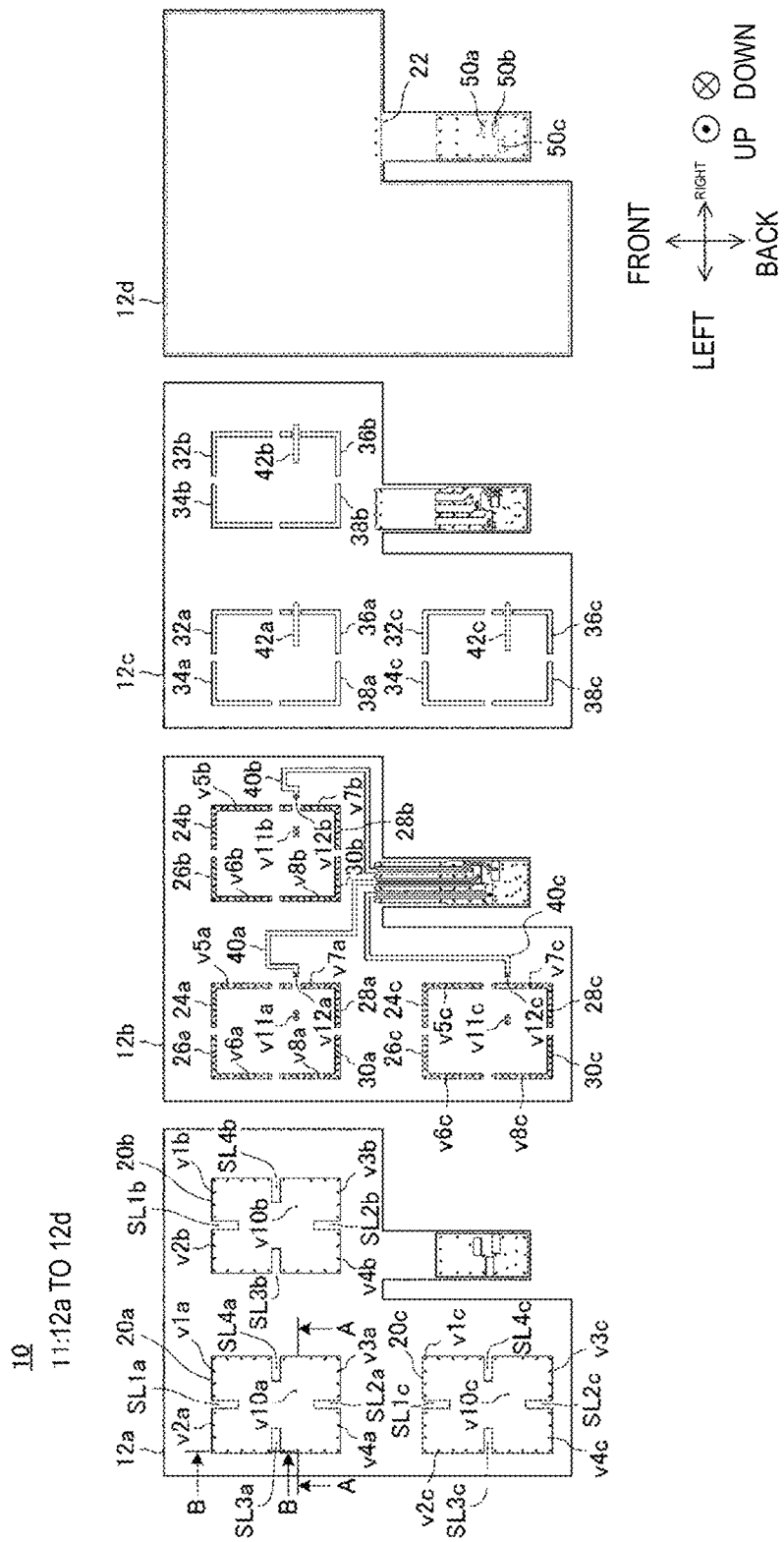
FIG. 1 is an exploded view of a multilayer board 10.
Figure 2:
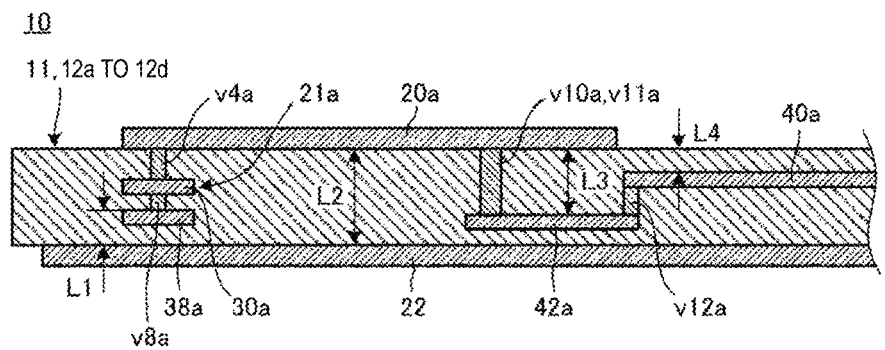
FIG. 2 is a sectional view of the multilayer board 10.
Figure 3:
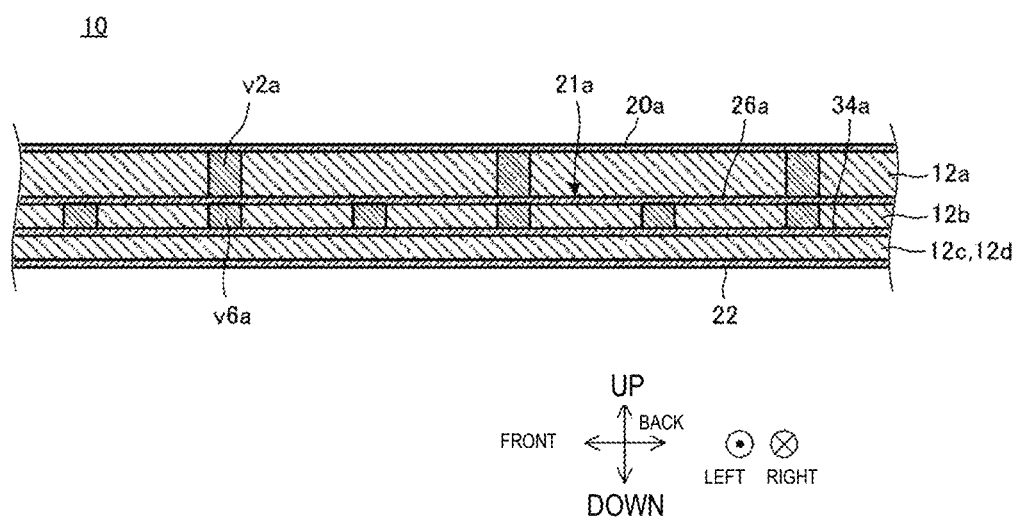
FIG. 3 is a sectional view of the multilayer board 10.

A multilayer board 10 according to preferred embodiments of the present invention are described below with reference to the drawings. FIG. 1 is an exploded view of the multilayer board 10. In FIG. 1, a top view of insulator layers 12a to 12d of the multilayer board 10 is depicted. FIG. 2 is a sectional view of the multilayer board 10. In FIG. 2, a section along A-A of FIG. 1 is depicted. FIG. 3 is a sectional view of the multilayer board 10. In FIG. 3, a section along B-B of FIG. 1 is depicted. FIG. 4 is a diagram depicting an example of use of the multilayer board 10.

Also in the specification, directions are defined as follows. A laminating direction of an element assembly 11 of the multilayer board 10 is defined as an up-down direction. In the present preferred embodiment, an upward direction is a first direction. A downward direction is a second direction. Also, the up-down direction, a left-right direction, and a front-back direction are orthogonal to one another. Note that the definitions of the directions in the specification are of an example. Therefore, the directions in actual use of the multilayer board 10 and the directions in the specification are not required to match.

In the specification, an axis and members extending in the front-back direction do not necessarily indicate only an axis and members parallel to the front-back direction. The axis and members extending in the front-back direction refer to an axis and members tilted in a range of about ±45° with respect to the front-back direction. Similarly, an axis and members extending in the up-down direction refer to an axis and members tilted in a range of about ±45° with respect to the up-down direction. An axis and members extending in the left-right direction refer to an axis and members tilted in a range of about ±45° with respect to the left-right direction.

A first member, a second member, and a third member below are members, components, and so forth included in the multilayer board 10. In the specification, a statement that the first member is supported by the second member includes a case in which the first member is attached to the second member so as to be immovable with respect to the second member (that is, the first member is fixed to the second member) and a case in which the first member is attached to the second member so as to be movable with respect to the second member. Also, the statement that the first member is supported by the second member includes both of a case in which the first member is directly attached to the second member and a case in which the first member is attached to the second member via the third member.

In the present specification, a statement that the first member and the second member are aligned in the front-back direction indicates the following state. The state is such that, when the first member and the second member are viewed in a direction perpendicular to the front-back direction, both of the first member and the second member are arranged on any straight line indicating the front-back direction. In the specification, a statement that the first member and the second member are aligned in the front-back direction when viewed in the up-down direction indicates the following state. When the first member and the second member are viewed in the up-down direction, both of the first member and the second member are arranged on any straight line indicating the front-back direction. In this case, when the first member and the second member are viewed from a left-right direction different from the up-down direction, either one of the first member and the second member do not have to be arranged on any straight line indicating the front-back direction. Note that the first member and the second member may be in contact. The first member and the second member may be separated. The third member may be present between the first member and the second member. These definitions apply also to the directions other than the front-back direction.

In the specification, a statement that the first member is arranged in front of the second member indicates the following state. A portion of the first member is arranged in an area where the second member passes through when making parallel translation in a front direction. Thus, the first member may be accommodated in the area where the second member passes through when making parallel translation in the front direction, or may protrude from the area where the second member passes through when making parallel translation in the front direction. In this case, the first member and the second member are aligned in the front-back direction. These definitions apply also to the directions other than the front-back direction.

In the specification, a statement that the first member is arranged in front of the second member when viewed in the left-right direction indicates the following state. The first member and the second member are aligned in the front-back direction when viewed in the left-right direction and a portion of the first member which faces the second member is arranged in front of the second member when viewed in the left-right direction. In these definitions, the first member and the second member do not have to be aligned three-dimensionally in the front-back direction. These definitions apply also to cases when viewed in a direction other than the left-right direction. Also, these apply also to an arrangement in a direction other than the front-back direction.

In the specification, a statement that the first member is arranged forward of the second member indicates the following state. The first member is arranged in front of a plane passing through a front end of the second member and orthogonal to the front-back direction. In this case, the first member and the second member may be aligned in the front-back direction or do not have to be aligned such. These definitions apply also to a direction other than the front-back direction.

In the specification, unless otherwise specified, each portion of the first member is defined as follows. A front portion of the first member is a front half of the first member. A rear portion of the first member is a rear half of the first member. A left portion of the first member is a left half of the first member. A right portion of the first member is a right half of the first member. An upper portion of the first member is an upper half of the first member. A lower portion of the first member is a lower half of the first member. A front end of the first member is an end in a front direction of the first member. A rear end of the first member is an end in a rear direction of the first member. A left end of the first member is an end in a left direction of the first member. A right end of the first member is an end in a right direction of the first member. An upper end of the first member is an end in an upward direction of the first member. A lower end of the first member is an end in a downward direction of the first member. A front end portion of the first member is the front end of the first member and its vicinity. A rear end portion of the first member is the rear end of the first member and its vicinity. A left end portion of the first member is the left end of the first member and its vicinity. A right end portion of the first member is the right end of the first member and its vicinity. An upper end portion of the first member is the upper end of the first member and its vicinity. A lower end portion of the first member is the lower end of the first member and its vicinity.

In the specification, a statement that the first member and the second member are electrically connected includes the following two meanings. The first meaning is that the first member and the second member are physically in contact, thus allowing a direct current to flow through the first member and the second member. The second meaning is that the first member and the third member are physically in contact and the third member and the second member are physically in contact, thus allowing a direct current to flow through the first member and the second member. In the second meaning, the first member and the second member may be physically in contact or do not have to be in contact. In the second meaning, the third member may be a single member or may include a plurality of members.

The multilayer board 10 is used for, by way of example, electronic device such as a mobile phone. The multilayer board 10 include, as depicted in FIG. 1, the element assembly 11, radiant conductor layers 20a to 20c, first capacitance defining portions 21a to 21c (refer to FIG. 2, where the first capacitance defining portions 21b and 21c are not depicted), a ground conductor 22, interlayer connection conductors v10a to v12a, v10b to v12b, and v10c to v12c, signal conductor layers 40a to 40c and 42a to 42c, and outer electrodes 50a to 50c.

The first capacitance defining portion 21b, the interlayer connection conductors v10b to v12b, the signal conductor layers 40b and 42b, and the outer electrode 50b have the same structures as those of the first capacitance defining portion 21a, the interlayer connection conductors v10a to v12a, the signal conductor layers 40a and 42a, and the outer electrode 50a. The first capacitance defining portion 21c, the interlayer connection conductors v10c to v12c, the signal conductor layers 40c and 42c, and the outer electrode 50c have the same structures as those of the first capacitance defining portion 21a, the interlayer connection conductors v10a to v12a, the signal conductor layers 40a and 42a, and the outer electrode 50a. Hence, description is provided below of the first capacitance defining portion 21a, the interlayer connection conductors v10a to v12a, the signal conductor layers 40a and 42a, and the outer electrode 50a. Description of the first capacitance defining portion 21b, the interlayer connection conductors v10b to v12b, the signal conductor layers 40b and 42b, and the outer electrode 50b is omitted. Description of the first capacitance defining portion 21c, the interlayer connection conductors v10c to v12c, the signal conductor layers 40c and 42c, and the outer electrode 50c is omitted.

The element assembly 11 has a plate shape having two principal surfaces orthogonal to the up-down direction. Therefore, the thickness of the element assembly 11 in the up-down direction is sufficiently small compared with the length of the element assembly 11 in the front-back direction and the length of the element assembly 11 in the left-right direction. For example, the thickness is about 100 μm, and the length is about 20 mm. The two principal surfaces are an upper surface and a lower surface. The element assembly 11 has flexibility. Thus, the element assembly 11 can be folded. The element assembly 11 has a structure with a plurality of insulator layers 12a to 12d laminated in the up-down direction. Therefore, the plurality of insulator layers 12a to 12d include the insulator layer 12a (first insulator layer) and the insulator layer 12d (second insulator layer). The insulator layers 12a to 12d are aligned in this order from top to bottom. Therefore, the insulator layer 12a is arranged above the insulator layer 12d.

The insulator layers 12a to 12d are dielectric sheets made of a thermoplastic resin with flexibility such as polyimide, liquid-crystal polymer, or the like. The insulator layers 12a to 12d each have two principal surfaces orthogonal to the up-down direction. The two principal surfaces are an upper surface and a lower surface. A method of bonding the insulator layers 12a to 12d may be welding or adhesion in which an adhesive is used.

The radiant conductor layer 20a, the first capacitance defining portion 21a, and the ground conductor 22 define and function as a patch antenna. The radiant conductor layer 20a is provided on an upper surface or a lower surface of the insulator layer 12a. In the present preferred embodiment, the radiant conductor layer 20a is provided on the upper surface of the insulator layer 12a. The radiant conductor layer 20a has a rectangular shape when viewed in the up-down direction. Thus, the radiant conductor layer 20a has a front side, a rear side, a left side, and a right side. Note that a plurality of (for example, four in the present preferred embodiment) slits SL1a to SL4a extending from the outer edge of the radiant conductor layer 20a toward the inside of the radiant conductor layer 20a when viewed in the up-down direction are provided to the radiant conductor layer 20a. The slit SL1a extends from the center of the front side of the radiant conductor layer 20a to the rear direction. The slit SL2a extends from the center of the rear side of the radiant conductor layer 20a to the front direction. The slit SL3a extends from the center of the left side of the radiant conductor layer 20a to the right direction. The slit SL4a extends from the center of the right side of the radiant conductor layer 20a to the left direction.

Here, definitions of the slits SL1a to SL4a are described. The slits SL1a to SL4a are areas formed with the shape of the outer edge of the radiant conductor layer 20a discontinuously changing. The slits SL1a to SL4a are elongated areas where no conductor layer is present. The slits SL1a to SL4a are each formed with three portions around the elongated area where no conductor layer is present being surrounded by the conductor layer. The length of the slits SL1a to SL4a are, for example, twice as long as the width of the slits SL1a to SL4a or longer. Also, the front side, the rear side, the left side, and the right side of the radiant conductor layer 20a do not include the slits SL1a to SL4a, respectively. Note that the length of a slit is a length corresponding to the long side of the elongated area where no conductor layer is present. The width of a slit is a length corresponding to the short side of the elongated area where no conductor layer is present.

A length of the front side of the radiant conductor layer 20a and the length of the slit SL1a is on the order of about ½ of the wavelength of a high-frequency signal with the resonant frequency of the patch antenna. A length of the rear side of the radiant conductor layer 20a and the length of the slit SL2a is on the order of about ½ of the wavelength of a high-frequency signal with the resonant frequency of the patch antenna. A length of the left side of the radiant conductor layer 20a and the length of the slit SL3a is on the order of about ½ of the wavelength of a high-frequency signal with the resonant frequency of the patch antenna. A length of the right side of the radiant conductor layer 20a and the length of the slit SL4a is on the order of about ½ of the wavelength of a high-frequency signal with the resonant frequency of the patch antenna. In this manner, the resonant frequency of the patch antenna is determined by the shape of the radiant conductor layer 20a. The radiant conductor layer 20a as described above is made of a metal material with small resistivity containing silver or copper as a main component.

The ground conductor 22 is provided to an upper surface or a lower surface of the insulator layer 12d so as to overlap the radiant conductor layer 20a when viewed in the up-down direction (laminating direction). In the present preferred embodiment, the ground conductor 22 is provided on the lower surface of the insulator layer 12d. Therefore, the ground conductor 22 is arranged below the radiant conductor layer 20a. Also, the ground conductor 22 covers a substantially entire lower surface of the insulator layer 12d. The ground conductor 22 is not electrically connected to the radiant conductor layer 20a. To the ground conductor 22, a ground potential is connected. In the present preferred embodiment, as with the radiant conductor layer 20a, the ground conductor 22 is a conductor layer. The ground conductor 22 as described above is made of a metal material with small resistivity containing silver or copper as a main component.

The first capacitance defining portion 21a includes a plurality of first interlayer connection conductors via to v8a and capacitive conductor layers 24a, 26a, 28a, 30a, 32a, 34a, 36a, and 38a. In FIG. 1, there are a plurality of the first interlayer connection conductors via to v8a each. However, in FIG. 1, only typical first interlayer connection conductors via to v8a are each provided with reference characters.

The capacitive conductor layers 24a, 26a, 28a, and 30a are provided on the upper surface of the insulator layer 12b. The capacitive conductor layer 24a has a shape in which a front end of a straight line extending in the front-back direction and a right end of a straight line extending in the left-right direction are connected when viewed in the up-down direction. The capacitive conductor layer 24a overlaps a vicinity of a right portion of the front side of the radiant conductor layer 20a and a vicinity of a front portion of the right side of the radiant conductor layer 20a when viewed in the up-down direction. The capacitive conductor layer 26a has a shape in which a front end of a straight line extending in the front-back direction and a left end of a straight line extending in the left-right direction are connected when viewed in the up-down direction. The capacitive conductor layer 26a overlaps a vicinity of a left portion of the front side of the radiant conductor layer 20a and a vicinity of a front portion of the left side of the radiant conductor layer 20a when viewed in the up-down direction. The capacitive conductor layer 28a has a shape in which a rear end of a straight line extending in the front-back direction and a right end of a straight line extending in the left-right direction are connected when viewed in the up-down direction. The capacitive conductor layer 28a overlaps a vicinity of a right portion of the rear side of the radiant conductor layer 20a and a vicinity of a rear portion of the right side of the radiant conductor layer 20a when viewed in the up-down direction. The capacitive conductor layer 30a has a shape in which a rear end of a straight line extending in the front-back direction and a left end of a straight line extending in the left-right direction are connected when viewed in the up-down direction. The capacitive conductor layer 30a overlaps a vicinity of a left portion of the rear side of the radiant conductor layer 20a and a vicinity of a rear portion of the left side of the radiant conductor layer 20a when viewed in the up-down direction.

The capacitive conductor layers 32a, 34a, 36a and 38a are provided on the upper surface of the insulator layer 12c. The capacitive conductor layers 32a, 34a, and 38a have the same shapes as those of the capacitive conductor layers 24a, 26a, and 30a, respectively. Also, the capacitive conductor layers 32a, 34a, and 38a overlap the capacitive conductor layers 24a, 26a, and 30a, respectively, as being matched together when viewed in the up-down direction. The capacitive conductor layer 36a has a shape of the capacitive conductor layer 28a partially lost. However, the capacitive conductor layer 36a has a shape substantially identical to that of the capacitive conductor layer 28a. Also, the capacitive conductor layer 36a overlaps the capacitive conductor layer 28a as being substantially matched together when viewed in the up-down direction. The capacitive conductor layers 24a, 26a, 28a, 30a, 32a, 34a, 36a, and 38a as described above are made of a metal material with small resistivity containing silver or copper as a main component.

The plurality of first interlayer connection conductors via to v8a pass through one or more insulator layers 12a and 12b among the plurality of insulator layers 12a to 12d in the up-down direction. In the present preferred embodiment, the plurality of first interlayer connection conductors via to v8a are via hole conductors. The via hole conductors are formed by filling through holes formed in the insulator layers 12a to 12d with conductive paste and curing the conductive paste by heat. The conductive paste contains a metal material with small resistivity containing silver or copper as a main component. The plurality of first interlayer connection conductors via to v4a penetrate through the insulator layer 12a in the up-down direction. The plurality of first interlayer connection conductors v5a to v8a penetrate through the insulator layer 12b in the up-down direction.

The plurality of first interlayer connection conductors via to v8a are electrically connected to the radiant conductor layer 20a or the ground conductor 22 arranged below the radiant conductor layer 20a. In the present preferred embodiment, the plurality of first interlayer connection conductors v1a to v8a are electrically connected to the radiant conductor layer 20a. The plurality of first interlayer connection conductors v1a to v8a are not electrically connected to the ground conductor 22. More specifically, the first interlayer connection conductors v1a to v8a are electrically connected to an outer edge portion of the radiant conductor layer 20a. The outer edge portion of the radiant conductor layer 20a is an area positioned between an outer edge of the radiant conductor layer 20a as a start point and a position spaced away by about ⅛ of the wavelength of a high-frequency signal of the resonant frequency of the patch antenna. An upper end of the plurality of first interlayer connection conductors v1a is connected to the radiant conductor layer 20a in a vicinity of a right portion of the front side of the radiant conductor layer 20a and a vicinity of a front portion of the right side of the radiant conductor layer 20a. A lower end of the plurality of first interlayer connection conductors v1a is connected to the capacitive conductor layer 24a. The plurality of first interlayer connection conductors v1a are equidistantly aligned along the front side of the radiant conductor layer 20a and the right side of the radiant conductor layer 20a. An upper end of the plurality of first interlayer connection conductors v2a is connected to the radiant conductor layer 20a in a vicinity of a left portion of the front side of the radiant conductor layer 20a and a vicinity of a front portion of the left side of the radiant conductor layer 20a. A lower end of the plurality of first interlayer connection conductors v2a is connected to the capacitive conductor layer 26a. The plurality of first interlayer connection conductors v2a are equidistantly aligned along the front side of the radiant conductor layer 20a and the left side of the radiant conductor layer 20a. An upper end of the plurality of first interlayer connection conductors v3a is connected to the radiant conductor layer 20a in a vicinity of a right portion of the rear side of the radiant conductor layer 20a and a vicinity of a rear portion of the right side of the radiant conductor layer 20a. A lower end of the plurality of first interlayer connection conductors v3a is connected to the capacitive conductor layer 28a. The plurality of first interlayer connection conductors v3a are equidistantly aligned along the rear side of the radiant conductor layer 20a and the right side of the radiant conductor layer 20a. An upper end of the plurality of first interlayer connection conductors v4a is connected to the radiant conductor layer 20a in a vicinity of a left portion of the rear side of the radiant conductor layer 20a and a vicinity of a rear portion of the left side of the radiant conductor layer 20a. A lower end of the plurality of first interlayer connection conductors v4a is connected to the capacitive conductor layer 30a. The plurality of first interlayer connection conductors v4a are equidistantly aligned along the rear side of the radiant conductor layer 20a and the left side of the radiant conductor layer 20a.

An upper end of the plurality of first interlayer connection conductors v5a is connected to the capacitive conductor layer 24a. A lower end of the plurality of first interlayer connection conductors v5a is connected to the capacitive conductor layer 32a. With this, the plurality of first interlayer connection conductors v5a are electrically connected to the radiant conductor layer 20a via the capacitive conductor layer 24a and the first interlayer connection conductors v1a. The plurality of first interlayer connection conductors v5a are equidistantly aligned along the front side of the radiant conductor layer 20a and the right side of the radiant conductor layer 20a. An upper end of the plurality of first interlayer connection conductors v6a is connected to the capacitive conductor layer 26a. A lower end of the plurality of first interlayer connection conductors v6a is connected to the capacitive conductor layer 34a. With this, the plurality of first interlayer connection conductors v6a are electrically connected to the radiant conductor layer 20a via the capacitive conductor layer 26a and the first interlayer connection conductors v2a. The plurality of first interlayer connection conductors v6a are equidistantly aligned along the front side of the radiant conductor layer 20a and the left side of the radiant conductor layer 20a. An upper end of the plurality of first interlayer connection conductors v7a is connected to the capacitive conductor layer 28a. A lower end of the plurality of first interlayer connection conductors v7a is connected to the capacitive conductor layer 36a. With this, the plurality of first interlayer connection conductors v7a are electrically connected to the radiant conductor layer 20a via the capacitive conductor layer 28a and the first interlayer connection conductors v3a. The plurality of first interlayer connection conductors v7a are equidistantly aligned along the rear side of the radiant conductor layer 20a and the right side of the radiant conductor layer 20a. An upper end of the plurality of first interlayer connection conductors v8a is connected to the capacitive conductor layer 30a. A lower end of the plurality of first interlayer connection conductors v8a is connected to the capacitive conductor layer 38a. With this, the plurality of first interlayer connection conductors v8a are electrically connected to the radiant conductor layer 20a via the capacitive conductor layer 30a and the first interlayer connection conductors v4a. The plurality of first interlayer connection conductors v8a are equidistantly aligned along the rear side of the radiant conductor layer 20a and the left side of the radiant conductor layer 20a.

However, the number of the plurality of first interlayer connection conductors v1a is approximately half of the number of the plurality of first interlayer connection conductors v5a, as depicted in FIG. 1. Also, the first interlayer connection conductors v1a overlap the first interlayer connection conductors v5a when viewed in the up-down direction. The number of the plurality of first interlayer connection conductors v2a is approximately half of the number of the plurality of first interlayer connection conductors v6a, as depicted in FIG. 1 and FIG. 3. Also, the first interlayer connection conductors v2a overlap the first interlayer connection conductors v6a when viewed in the up-down direction. The number of the plurality of first interlayer connection conductors v3a is approximately half of the number of the plurality of first interlayer connection conductors v7a, as depicted in FIG. 1. Also, the first interlayer connection conductors v3a overlap the first interlayer connection conductors v7a when viewed in the up-down direction. The number of the plurality of first interlayer connection conductors v4a is approximately half of the number of the plurality of first interlayer connection conductors v8a, as depicted in FIG. 1. Also, the first interlayer connection conductors v4a overlap the first interlayer connection conductors v8a when viewed in the up-down direction.

When the plurality of first interlayer connection conductors v1a to v8a are electrically connected to the radiant conductor layer 20a, a distance L1 from the lower end of the plurality of first interlayer connection conductors v1a to v8a to the ground conductor 22 in the up-down direction is shorter than a distance L2 from the radiant conductor layer 20a to the ground conductor 22 in the up-down direction, as depicted in FIG. 2.

A capacitance is generated between the capacitive conductor layers 32a, 34a, 36a, and 38a and the ground conductor 22. This capacitance is added to a capacitance occurring between the radiant conductor layer 20a and the ground conductor 22. In this manner, the first capacitance defining portion 21a adds a further capacitance to the capacitance occurring between the radiant conductor layer 20a and the ground conductor 22.

The signal conductor layer 42a is provided on the upper surface of the insulator layer 12c. The signal conductor layer 42a has a straight line shape extending in the left-right direction when viewed in the up-down direction. A left end portion of the signal conductor layer 42a overlaps a left portion and a lower portion of the radiant conductor layer 20a. A right end portion of the signal conductor layer 42a is positioned on the right of the radiant conductor layer 20a when viewed in the up-down direction. Therefore, the right end portion of the signal conductor layer 42a does not overlap the radiant conductor layer 20a when viewed in the up-down direction. The signal conductor layer 42a as described above is made of a metal material with small resistivity containing silver or copper as a main component.

The signal conductor layer 40a is provided on the upper surface of the insulator layer 12b. Therefore, a distance L3 from the signal conductor layer 42a to the radiant conductor layer 20a in the up-down direction is longer than a distance L4 from the signal conductor layer 40a to the radiant conductor layer 20a in the up-down direction. With this, capacitive coupling of the signal conductor layer 40a with the radiant conductor layer 20a is reduced or prevented. The signal conductor layer 40a has a linear shape when viewed in the up-down direction. A first end portion of the signal conductor layer 40a overlaps a right end portion of the signal conductor layer 42a when viewed in the up-down direction. The signal conductor layer 40a as described above is made of a metal material with small resistivity containing silver or copper as a main component.

The interlayer connection conductors v10a to v12a pass through the plurality of insulator layers 12a and 12b in the up-down direction. In the present preferred embodiment, the interlayer connection conductors v10a to v12a are via hole conductors. The via hole conductors are formed by filling through holes formed in the insulator layers 12a and 12b with conductive paste and firing the conductive paste. The conductive paste contains a metal material with small resistivity containing silver or copper as a main component.

The interlayer connection conductor v10a penetrates through the insulator layer 12a in the up-down direction. An upper end of the interlayer connection conductor v10a is connected to the radiant conductor layer 20a. The interlayer connection conductor v11a penetrates through the insulator layer 12b in the up-down direction. An upper end of the interlayer connection conductor v11a is connected to a lower end of the interlayer connection conductor v10a. A lower end of the interlayer connection conductor v11a is connected to a left end portion of the signal conductor layer 42a.

The interlayer connection conductor v12a does not overlap the radiant conductor layer 20a when viewed in the up-down direction. With this, capacitive coupling of the interlayer connection conductor v12a with the radiant conductor layer 20a is reduced or prevented. The interlayer connection conductor v12a penetrates through the insulator layer 12b in the up-down direction. An upper end of the interlayer connection conductor v12a is connected to one end portion of the signal conductor layer 40a. A lower end of the interlayer connection conductor v12a is connected to a right end portion of the signal conductor layer 42a. With this, the radiant conductor layer 20a is electrically connected to the signal conductor layers 40a and 42a. That is, the signal conductor layer 40a is electrically connected to the radiant conductor layer 20a. However, the interlayer connection conductor v12a may overlap the radiant conductor layer 20a when viewed in the up-down direction.

The outer electrode 50a is provided on the lower surface of the insulator layer 12d. The outer electrode 50a is a conductor layer having a rectangular shape. The outer electrode 50a is electrically connected to a second end portion of the signal conductor layer 40a. On the outer electrode 50a, a connector 60 described below is mounted. The outer electrode 50a has a structure in which, for example, Ni plating and Sn plating are applied on a copper foil provided on the lower surface of the insulator layer 12d.

The multilayer board 10 includes a plurality of sets of a radiant conductor layer, a ground conductor, and a first capacitance defining portion which define and function as a patch antenna. Specifically, the multilayer board 10 includes the radiant conductor layer 20a, the first capacitance defining portion 21a, and the ground conductor 22 which define and function as a patch antenna; the radiant conductor layer 20b, the first capacitance defining portion 21b, and the ground conductor 22 which define and function as a patch antenna; and the radiant conductor layer 20c, the first capacitance defining portion 21c, and the ground conductor 22 which define and function as a patch antenna. In this case, the length of the signal conductor layer 40a, the length of the signal conductor layer 40b, and the length of the signal conductor layer 40c are equal or substantially equal. Thus, the signal conductor layers 40a to 40c each do not have a straight line shape. The signal conductor layers 40a to 40c each have a detour structure. With this, the occurrence of a difference in electrical characteristics among a plurality of patch antennas is reduced or prevented. Here, to reduce or prevent capacitive coupling between the signal conductor layer 40a and the signal conductor layer 40b, the signal conductor layer 40a and the signal conductor layer 40b detour so as to be separated. To reduce or prevent capacitive coupling between the signal conductor layer 40b and the signal conductor layer 40c, the signal conductor layer 40b and the signal conductor layer 40c detour so as to be separated. To reduce or prevent capacitive coupling between the signal conductor layer 40c and the signal conductor layer 40a, the signal conductor layer 40c and the signal conductor layer 40a detour so as to be separated. Also, in a section where the signal conductor layers 40a to 40c run in parallel, a ground conductor layer is provided between the signal conductor layer 40a and the signal conductor layer 40b, between the signal conductor layer 40b and the signal conductor layer 40c, and between the signal conductor layer 40c and the signal conductor layer 40a.

The multilayer board 10 further includes the connector 60 as depicted in FIG. 4. The connector 60 is mounted on the outer electrodes 50a to 50c. The connector 60 electrically connects the multilayer board 10 and a circuit board 70 together. More specifically, the circuit board 70 includes a board body 71 and a connector 72. The connector 72 is mounted on the lower surface of the board body 71. The connector 60 is connected to the connector 72. Here, the multilayer board 10 is arranged on the circuit board 70. Hence, with the element assembly 11 being folded, the connector 60 is positioned below the lower surface of the circuit board 70.

In the multilayer board 10 as described above, a transmission high-frequency signal is inputted via the connector 60 to the multilayer board 10. The transmission high-frequency signal is applied via the signal conductor layers 40a and 42a and the interlayer connection conductors v10a to v12a to the radiant conductor layer 20a. With this, resonance occurs in the radiant conductor layer 20a, and a transmission high-frequency signal is emitted from the radiant conductor layer 20a as an electromagnetic wave. Also, when the radiant conductor layer 20a receives a reception high-frequency signal, resonance occurs in the radiant conductor layer 20a. The reception high-frequency signal is outputted from the connector 60 via the signal conductor layers 40a and 42a and the interlayer connection conductors v10a to v12a to the outside of the multilayer board 10 (that is, to the circuit board 70).

Effects

According to the multilayer board 10, the resonant frequency of the patch antenna can be decreased. More specifically, when the plurality of first interlayer connection conductors via to v8a are electrically connected to the radiant conductor layer 20a, the distance L1 from the lower end of the plurality of first interlayer connection conductors via to v8a to the ground conductor 22 in the up-down direction is shorter than the distance L2 from the radiant conductor layer 20a to the ground conductor 22 in the up-down direction. With this, capacitance occurs between the capacitive conductor layers 32a, 34a, 36a, and 38a and the ground conductor 22. This capacitance is added to the capacitance occurring between the radiant conductor layer 20a and the ground conductor 22. When the capacitance occurring between the radiant conductor layer 20a and the ground conductor 22 is increased, the resonant frequency of the patch antenna is decreased.

According to the multilayer board 10, an increase in loss of the patch antenna can be reduced or prevented. More specifically, in the patch antenna described in Japanese Unexamined Patent Application Publication No. 2008-236362, the radiant electrode includes a slit-shaped notched part. With this, the resonant frequency of the patch antenna is decreased. However, when the radiant electrode includes a notched part, the outer edge of the radiant electrode is elongated. As a result, the resistance value of the radiant electrode is increased, and loss in patch antenna is increased. On the other hand, in the multilayer board 10, the resonant frequency of the patch antenna is decreased by the first capacitance defining portion 21a. The first capacitance defining portion 21a does not increase the resistance value of the radiant conductor layer 20a. Therefore, according to the multilayer board 10, an increase in loss in the patch antenna can be reduced or prevented.

According to the multilayer board 10, the resonant frequency of the patch antenna can be decreased also because of the following reason. More specifically, when resonance occurs in the radiant conductor layer 20a, currents concentrate on the outer edge portion of the radiant conductor layer 20a due to the skin effect. Hence, in the multilayer board 10, the plurality of first interlayer connection conductors via to v8a are electrically connected to the outer edge portion of the radiant conductor layer 20a. With this, capacitance is applied to the outer edge portion of the radiant conductor layer 20a. As a result, the resonant frequency of the patch antenna can be effectively decreased.

According to the multilayer board 10, the resonant frequency of the patch antenna can be decreased also because of the following reason. More specifically, when viewed in the up-down direction, the slits SL1a to SL4a extending from the outer edge of the radiant conductor layer 20a toward the inside of the radiant conductor layer 20a are provided to the radiant conductor layer 20a. With this, the length of the outer edge of the radiant conductor layer 20a is elongated. The wavelength of the high-frequency signal resonating in the radiant conductor layer 20a is elongated. As a result, the resonant frequency of the patch antenna can be decreased.

Modification 1

Figure 5:
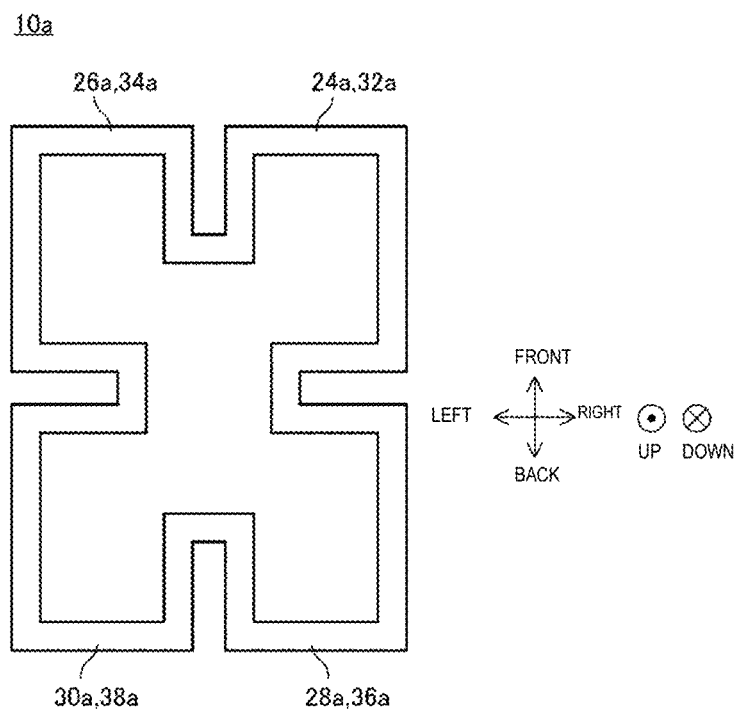
FIG. 5 is a top view of capacitive conductor layers 24a, 26a, 28a, 30a, 32a, 34a, 36a, and 38a of a multilayer board 10a according to Modification 1.

A multilayer board 10a according to Modification 1 is described below with reference to the drawings. FIG. 5 is a top view of capacitive conductor layers 24a, 26a, 28a, 30a, 32a, 34a, 36a, and 38a of the multilayer board 10a according to Modification 1.

The multilayer board 10a is different from the multilayer board 10 in the shapes of the capacitive conductor layers 24a, 26a, 28a, 30a, 32a, 34a, 36a, and 38a. More specifically, in the multilayer board 10a, capacitive conductor layers are provided also on the perimeter of the slits SL1a to SL4a. With this, the capacitive conductor layers 24a, 26a, 28a, and 30a are connected as one. Note that since the other structures of the multilayer board 10a are identical to those of the multilayer board 10, their description is omitted.

According to the multilayer board 10a, the resonant frequency of the patch antenna can be decreased because of the same reason as that for the multilayer board 10. According to the multilayer board 10a, an increase in loss in the patch antenna can be reduced or prevented because of the same reason as that for the multilayer board 10.

Modification 2

A multilayer board 10b according to Modification 2 is described below with reference to the drawings. FIG. 6 is a sectional view of the multilayer board 10b according to Modification 2. In FIG. 6, a sectional view at a position corresponding to B-B of FIG. 1 is depicted.

The multilayer board 10b is different from the multilayer board 10 in the spacing among the plurality of first interlayer connection conductors via to v4a. The spacing among the plurality of first interlayer connection conductors via to v4a in the multilayer board 10b is larger than the spacing among the plurality of first interlayer connection conductors via to v4a in the multilayer board 10. With this, the occurrence of capacitive coupling between adjacent two first interlayer connection conductors via to v4a is reduced or prevented.

Also, the number of the plurality of first interlayer connection conductors via is approximately ⅓ of the number of the plurality of first interlayer connection conductors v5a. Also, when viewed in the up-down direction, the first interlayer connection conductors via do not overlap the first interlayer connection conductor v5a. The number of the plurality of first interlayer connection conductors v2a is approximately ⅓ of the number of the plurality of first interlayer connection conductors v6a, as depicted in FIG. 6. Also, when viewed in the up-down direction, the first interlayer connection conductors v2a do not overlap the first interlayer connection conductor v6a. The number of the plurality of first interlayer connection conductors v3a is approximately ⅓ of the number of the plurality of first interlayer connection conductors v7a. Also, when viewed in the up-down direction, the first interlayer connection conductors v3a do not overlap the first interlayer connection conductor v7a. The number of the plurality of first interlayer connection conductors v4a is approximately ⅓ of the number of the plurality of first interlayer connection conductors v8a. Also, when viewed in the up-down direction, the first interlayer connection conductors v4a do not overlap the first interlayer connection conductor v8a. With this, breakage of the element assembly 11 is reduced or prevented.

According to the multilayer board 10b, the resonant frequency of the patch antenna can be decreased because of the same reason as that for the multilayer board 10. According to the multilayer board 10b, an increase in loss in the patch antenna can be reduced or prevented because of the same reason as that for the multilayer board 10.

Modification 3

Figure 7:
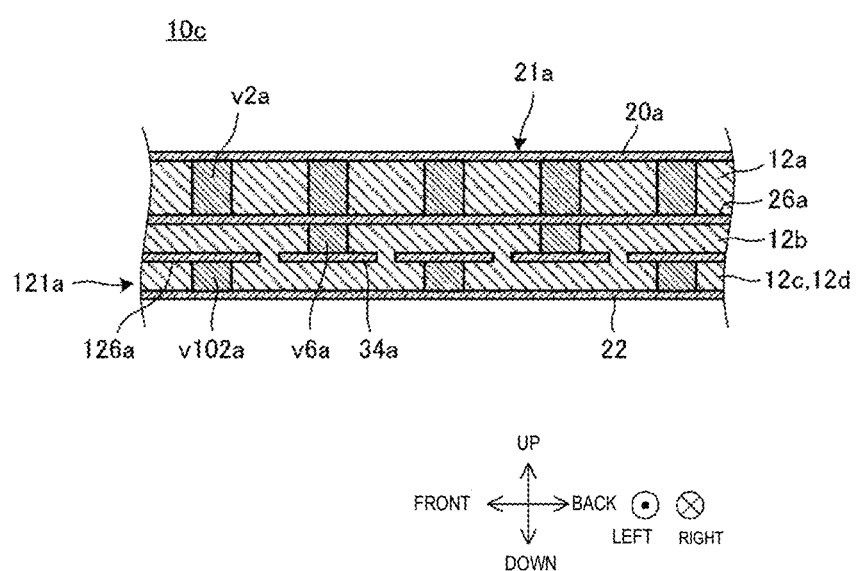
FIG. 7 is a sectional view of a multilayer board 10c according to Modification 3.

A multilayer board 10c according to Modification 3 is described below with reference to the drawings. FIG. 7 is a sectional view of the multilayer board 10c according to Modification 3. In FIG. 7, a sectional view at a position corresponding to B-B of FIG. 1 is depicted.

The multilayer board 10c is different from the multilayer board 10 in further including a second capacitance defining portion 121a. This difference is described below in more detail.

The first capacitance defining portion 21a includes the plurality of first interlayer connection conductors v2a, the plurality of first interlayer connection conductors v6a, the capacitive conductor layer 26a, and a plurality of capacitive conductor layers 34a. The number of the plurality of first interlayer connection conductors v2a is twice as many as the number of the plurality of first interlayer connection conductors v6a. Therefore, the plurality of first interlayer connection conductors v6a are connected to a plurality of first interlayer connection conductors v2a, which are half of the plurality of first interlayer connection conductors v2a. With this, the first interlayer connection conductors v2a under which no first interlayer connection conductor v6a is present and the first interlayer connection conductors v2a under which the first interlayer connection conductors v6a are present are alternately aligned. Lower ends of the plurality of the first interlayer connection conductors v6a are respectively connected to the capacitive conductor layers 34a. With this, the plurality of first interlayer connection conductors v2a, the plurality of first interlayer connection conductors v6a, the capacitive conductor layer 26a, and the plurality of capacitive conductor layers 34a are electrically connected to the radiant conductor layer 20a.

The second capacitance defining portion 121a includes a plurality of second interlayer connection conductors v102a and a plurality of capacitive conductor layers 126a. The plurality of capacitive conductor layers 126a are provided on the upper surface of the insulator layer 12c. The plurality of capacitive conductor layers 126a and the plurality of capacitive conductor layers 34a are alternately aligned.

The plurality of second interlayer connection conductors v102a traverse one or more insulator layers 12d among the plurality of insulator layers 12a to 12d in the up-down direction. In the present modification, the second interlayer connection conductors v102a are via hole conductors. Therefore, the second interlayer connection conductors v102a penetrate through the insulator layers 12d in the up-down direction. Upper ends of the second interlayer connection conductors v102a are connected to the capacitive conductor layers 126a. Lower ends of the second interlayer connection conductors v102a are connected to the ground conductor 22. With this, the plurality of second interlayer connection conductors v102a are electrically connected to the ground conductor 22. When viewed in a direction orthogonal to the up-down direction, the plurality of first interlayer connection conductors v6a and the plurality of second interlayer connection conductors v102a are alternately aligned.

According to the multilayer board 10c, the resonant frequency of the patch antenna can be decreased because of the same reason as that for the multilayer board 10. According to the multilayer board 10c, an increase in loss in the patch antenna can be reduced or prevented because of the same reason as that for the multilayer board 10.

According to the multilayer board 10c, the occurrence of variations in resonant frequency of the patch antenna can be reduced or prevented because of the following reason. More specifically, in multilayer board 10c, portions where the first interlayer connection conductors v2a and the second interlayer connection conductors v102a are aligned in the up-down direction and portions where the first interlayer connection conductors v2a and the first interlayer connection conductors v6a are aligned in the up-down direction are alternately aligned. Thus, in the portions where the first interlayer connection conductors v2a and the second interlayer connection conductors v102a are aligned in the up-down direction, the capacitive conductor layer 26a to which a high-frequency signal is applied and the capacitive conductor layers 126a to which a ground potential is connected are opposed in the up-down direction. In the portions where the first interlayer connection conductors v2a and the first interlayer connection conductors v6a are aligned in the up-down direction, the capacitive conductor layers 34a to which a high-frequency signal is applied and the ground conductor 22 connected to a ground potential are opposed in the up-down direction. A distance from the capacitive conductor layer 26a to the capacitive conductor layers 126a in the up-down direction is equal or substantially equal to a distance from the capacitive conductor layers 34a to the ground conductor 22 in the up-down direction. Thus, variations in the distance between the conductor layer to which a high-frequency signal is applied and the conductor layer to which a ground potential is connected less tend to occur. As a result, the occurrence of variations in resonant frequency of the patch antenna is reduced or prevented.

According to the multilayer board 10c, the capacitive conductor layers 34a and the capacitive conductor layers 126a are adjacent to each other in the front-back direction. Thus, capacitance occurs between the capacitive conductor layers 34a and the capacitive conductor layers 126a. As a result, the resonant frequency of the patch antenna can be decreased.

Modification 4

Figure 8:
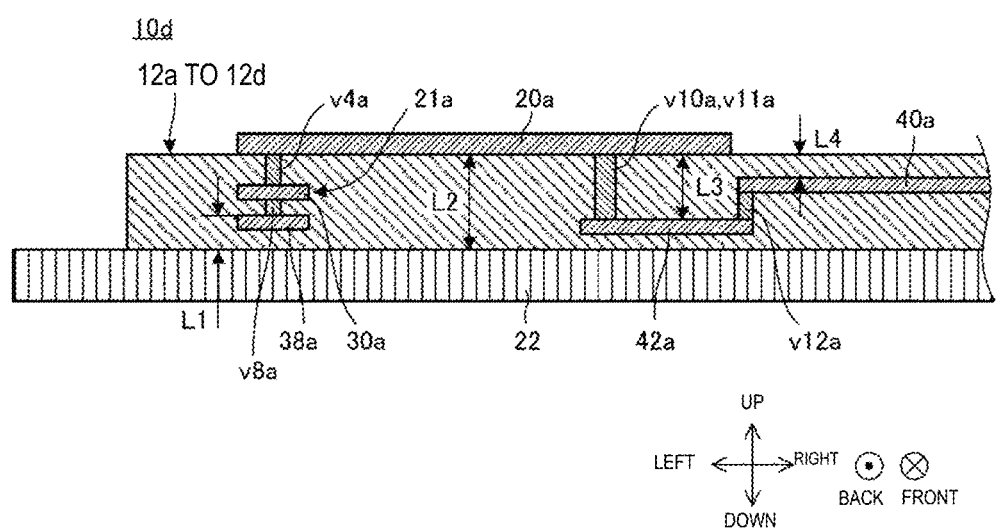
FIG. 8 is a sectional view of a multilayer board 10d according to Modification 4.

A multilayer board 10d according to Modification 4 is described below with reference to the drawings. FIG. 8 is a sectional view of the multilayer board 10d according to Modification 4. In FIG. 8, a sectional view at a position corresponding to A-A of FIG. 1 is depicted.

The multilayer board 10d is different from the multilayer board 10 in not including the ground conductor 22. More specifically, the ground conductor 22 is provided outside the multilayer board 10d so as to overlap the radiant conductor layer 20a when viewed in the up-down direction (laminating direction). The ground conductor 22 in the present modification is, for example, a housing of an electronic device where the multilayer board 10d is used. The housing of the electronic device is made of a metal having conductivity. Also, the housing of the electronic device is connected to a ground potential. The lower surface of the element assembly 11 is fixed to the upper surface of the ground conductor 22 as the housing of the electronic device. As for a method of fixing the element assembly 11 to the ground conductor 22, fixing by an adhesive or fixing with fittings for fixing may be used.

According to the multilayer board 10d, the resonant frequency of the patch antenna can be decreased because of the same reason as that for the multilayer board 10. According to the multilayer board 10d, an increase in loss in the patch antenna can be reduced or prevented because of the same reason as that for the multilayer board 10.

Note that the ground conductor 22 is not limited to the housing of the electronic device. The ground conductor 22 may be, for example, a ground conductor layer included in the circuit board 70 of FIG. 4.

Modification 5

Figure 9:
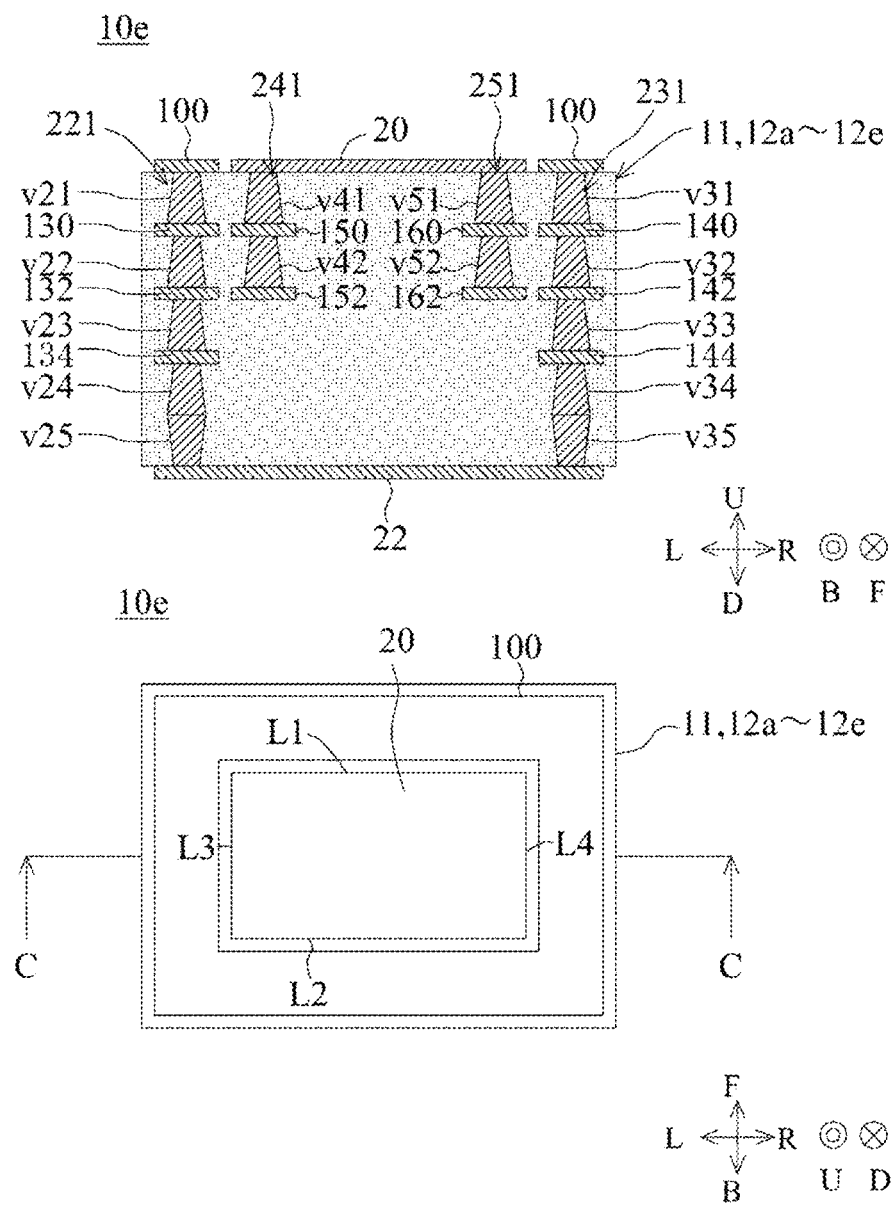
FIG. 9 depicts a sectional view and a top view of a multilayer board 10e according to Modification 5.

A multilayer board 10e according to Modification 5 is described below with reference to the drawings. FIG. 9 depicts a sectional view and a top view of the multilayer board 10e according to Modification 5. In FIG. 9, a sectional view at a position corresponding to C-C of FIG. 9 is depicted.

The multilayer board 10e is different from the multilayer board 10 in including a frame-shaped conductor layer 100, a first capacitance defining portion 221, a third capacitance defining portion 231, and fourth capacitance defining portions 241 and 251. The multilayer board 10e is described below mainly with respect to this difference.

The multilayer board 10e further includes the frame-shaped conductor layer 100. The frame-shaped conductor layer 100 is provided, together with the radiant conductor layer 20, on the upper surface or lower surface of the insulator layer 12a (first insulator layer). In the present preferred embodiment, the radiant conductor layer 20 and the frame-shaped conductor layer 100 are provided on the upper surface of the insulator layer 12a. The frame-shaped conductor layer 100 has a frame shape surrounding the radiant conductor layer 20 when viewed in the up-down direction. In the present preferred embodiment, the frame-shaped conductor layer 100 has a rectangular frame shape. The front long side and the rear long side of the frame-shaped conductor layer 100 extend in the left-right direction. The left short side and the right short side of the frame-shaped conductor layer 100 extend in the front-back direction.

Also, the radiant conductor layer 20 has a rectangular shape having a first long side L1, a second long side L2, a first short side L3, and a second short side L4 when viewed in the up-down direction. The first long side L1 and the second long side L2 extend in the left-right direction. The first long side L1 is positioned in front of the second long side L2. The first short side L3 and the second short side L4 extend in the front-back direction. The first short side L3 is positioned at the left of the second short side L4. Since the radiant conductor layer 20 has a rectangular shape, a patch antenna is configured, which is capable of transmitting and receiving a frequency depending on the length of the long sides of the radiant conductor layer 20 and a frequency depending on the length of the short sides of the radiant conductor layer 20.

The frame-shaped conductor layer 100 is electrically connected to the ground conductor 22. More specifically, the multilayer board 10e includes the first capacitance defining portion 221 and the third capacitance defining portion 231. The first capacitance defining portion 221 includes first interlayer connection conductors v21 to v25 and capacitive conductor layers 130, 132, and 134. The first interlayer connection conductors v21 to v25 are electrically connected in series. The first interlayer connection conductors v21 to v25 penetrate through the insulator layers 12a to 12e, respectively, in the up-down direction. An upper end of the first interlayer connection conductor v21 is connected to the left short side of the frame-shaped conductor layer 100. A lower end of the first interlayer connection conductor v25 is connected to the ground conductor 22. With this, the first interlayer connection conductors v21 to v25 are electrically connected to the ground conductor 22 and the frame-shaped conductor layer 100. However, the first interlayer connection conductors v21 to v25 do not overlap the radiant conductor layer 20 when viewed in the up-down direction.

The capacitive conductor layer 130 is connected to a lower end of the first interlayer connection conductor v21 and an upper end of the first interlayer connection conductor v22. The capacitive conductor layer 132 is connected to a lower end of the first interlayer connection conductor v22 and an upper end of the first interlayer connection conductor v23. The capacitive conductor layer 134 is connected to a lower end of the first interlayer connection conductor v23 and an upper end of the first interlayer connection conductor v24.

The third capacitance defining portion 231 includes a plurality of third interlayer connection conductors v31 to v35 traversing one or more insulator layers among the plurality of insulator layers 12a to 12e in the up-down direction and capacitive conductor layers 140, 142, and 144 (third capacitive conductor layers) electrically connected to the third interlayer connection conductors v31 to v35 and provided above the ground conductor 22 and below the radiant conductor layer 20. The third interlayer connection conductors v31 to v35 are electrically connected to the ground conductor 22 and the frame-shaped conductor layer 100. Note that the third interlayer connection conductors v31 to v35 and the capacitive conductor layers 140, 142, and 144 have a bilaterally symmetrical structure with respect to the first interlayer connection conductors v21 to v25 and the capacitive conductor layers 130, 132, and 134, respectively. Therefore, detailed description of the third interlayer connection conductors v31 to v35 and the capacitive conductor layers 140, 142, and 144 is omitted.

The fourth capacitance defining portion 241 includes fourth interlayer connection conductors v41 and v42 and capacitive conductor layers 150 and 152. The fourth interlayer connection conductors v41 and v42 traverse one or more insulator layers among the plurality of insulator layers 12a to 12e in the up-down direction. The fourth interlayer connection conductors v41 and v42 are electrically connected in series. The fourth interlayer connection conductors v41 and v42 penetrate through the insulator layers 12a and 12b, respectively, in the up-down direction. An upper end of the fourth interlayer connection conductor v41 is connected to the radiant conductor layer 20. The fourth interlayer connection conductors v41 and v42 are electrically connected to the radiant conductor layer 20. Also, a distance from a lower end of the fourth interlayer connection conductor v42 to the ground conductor 22 in the up-down direction is shorter than a distance from the radiant conductor layer 20 to the ground conductor 22 in the up-down direction.

The capacitive conductor layer 150 is connected to a lower end of the fourth interlayer connection conductor v41 and an upper end of the fourth interlayer connection conductor v42. The capacitive conductor layer 152 is connected to the lower end of the fourth interlayer connection conductor v42.

The fourth capacitance defining portion 251 includes fourth interlayer connection conductors v51 and v52 and capacitive conductor layers 160 and 162. However, since the fourth interlayer connection conductors v51 and v52 and the capacitive conductor layers 160 and 162 have a bilaterally symmetrical structure with respect to the fourth interlayer connection conductors v41 and v42 and the capacitive conductor layers 150 and 152, their description is omitted. Also, since the other structures of the multilayer board 10e are identical to those of the multilayer board 10, their description is omitted.

According to the multilayer board 10e, the resonant frequency of the patch antenna can be decreased because of the same reason as that for the multilayer board 10. According to the multilayer board 10e, an increase in loss in the patch antenna can be reduced or prevented because of the same reason as that for the multilayer board 10.

Also, according to the multilayer board 10e, directivity of the patch antenna can be improved. More specifically, the frame-shaped conductor layer 100 has a frame shape surrounding the radiant conductor layer 20 when viewed in the up-down direction. Furthermore, the frame-shaped conductor layer 100 is electrically connected to the ground conductor 22. With this, the periphery of the radiant conductor layer 20 is in a state of being shielded when viewed in the up-down direction. Thus, the radiant conductor layer 20 emits an electromagnetic field in an upward direction, and receives an electromagnetic field from above. As a result, according to the multilayer board 10e, directivity of the patch antenna can be improved.

Also, according to the multilayer board 10e, when the multilayer board 10e includes a plurality of patch antennas, isolation among the patch antennas increases. More specifically, the frame-shaped conductor layer 100 has a frame shape surrounding the radiant conductor layer 20 when viewed in the up-down direction. Furthermore, the frame-shaped conductor layer 100 is electrically connected to the ground conductor 22. With this, the periphery of the radiant conductor layer 20 is in a state of being shielded when viewed in the up-down direction. As a result, coupling among the plurality of patch antennas is reduced or prevented. Thus, according to the multilayer board 10e, when the multilayer board 10e includes a plurality of patch antennas, isolation among the plurality of patch antennas increases.

Modification 6

A multilayer board 10f according to Modification 6 is described below with reference to the drawings. FIG. 10 depicts a sectional view of the multilayer board 10f according to Modification 6.

The multilayer board 10f is different from the multilayer board 10e in that the third capacitance defining portion 231 and the fourth capacitance defining portions 241 and 251 are electrically connected to the ground conductor 22. Since the other structures of the multilayer board 10f are identical to those of the multilayer board 10e, their description is omitted.

According to the multilayer board 10f, the resonant frequency of the patch antenna can be decreased because of the same reason as that for the multilayer board 10e. According to the multilayer board 10f, an increase in loss in the patch antenna can be reduced or prevented because of the same reason as that for the multilayer board 10e. According to the multilayer board 10f, directivity of the patch antenna can be improved because of the same reason as that for the multilayer board 10e. According to the multilayer board 10f, because of the same reason as that for the multilayer board 10e, when the multilayer board 10f includes a plurality of patch antennas, isolation among the plurality of patch antennas increases.

Modification 7

A multilayer board 10g according to Modification 7 is described below with reference to the drawings. FIG. 11 depicts a sectional view and a top view of the multilayer board 10g according to Modification 7. In FIG. 11, a sectional view at a position corresponding to C-C of FIG. 11 is depicted.

The multilayer board 10g is different from the multilayer board 10e in the shapes of the capacitive conductor layers 132 and 142. The multilayer board 10g is described below mainly on this difference.

The first capacitance defining portion 221 includes the capacitive conductor layer 132 (first capacitive conductor layer) electrically connected to the first interlayer connection conductors v22 and v23 and provided above the ground conductor 22 and below the radiant conductor layer 20. The capacitive conductor layer 132 overlaps the radiant conductor layer 20 when viewed in the up-down direction. In the present preferred embodiment, the capacitive conductor layer 132 overlaps the first short side L3 of the radiant conductor layer 20 when viewed in the up-down direction.

The third capacitance defining portion 231 includes the capacitive conductor layer 142 (third capacitive conductor layer) electrically connected to the third interlayer connection conductors v32 and v33 and provided above the ground conductor 22 and below the radiant conductor layer 20. The capacitive conductor layer 142 overlaps the radiant conductor layer 20 when viewed in the up-down direction. In the present preferred embodiment, the capacitive conductor layer 142 overlaps the second short side L4 of the radiant conductor layer 20 when viewed in the up-down direction.

According to the multilayer board 10g, the resonant frequency of the patch antenna can be decreased because of the same reason as that for the multilayer board 10e. According to the multilayer board 10g, an increase in loss in the patch antenna can be reduced or prevented because of the same reason as that for the multilayer board 10e. According to the multilayer board 10g, directivity of the patch antenna can be improved because of the same reason as that for the multilayer board 10e. According to the multilayer board 10g, because of the same reason as that for the multilayer board 10, when the multilayer board 10g includes a plurality of patch antennas, isolation among the plurality of patch antennas increases.

According to the multilayer board 10g, the resonant frequency of the patch antenna can be decreased also because of the following reason. More specifically, the capacitive conductor layer 132 overlaps the first short side L3 of the radiant conductor layer 20 when viewed in the up-down direction. The capacitive conductor layer 142 overlaps the second short side L4 of the radiant conductor layer 20 when viewed in the up-down direction. With this, the capacitance generated between the radiant conductor layer 20 and the ground conductor 22 increases. As a result, according to the multilayer board 10g, the resonant frequency of the patch antenna is decreased.

According to the multilayer board 10g, degradation in radiation efficiency of the patch antenna is reduced or prevented. More specifically, the capacitive conductor layer 132 and the capacitive conductor layer 142 overlap the radiant conductor layer 20 when viewed in the up-down direction. The capacitive conductor layer 132 and the capacitive conductor layer 142 as described above can be a cause for degradation in radiation efficiency of the patch antenna. Meanwhile, in the radiant conductor layer 20, a standing wave occurs in which the length between the first short side L3 and the second short side L4 is an integral multiple of a substantially half wave. In this case, the current value near the first short side L3 and the second short side L4 is smaller than the current value at the center of the radiant conductor layer 20. Thus, even if the capacitance value near the first short side L3 and the second short side L4 becomes varied, radiation characteristics of the patch antenna less tend to be varied. Hence, in the multilayer board 10g, the capacitive conductor layer 132 overlaps the first short side L3 of the radiant conductor layer 20 when viewed in the up-down direction. The capacitive conductor layer 142 overlaps the second short side L4 of the radiant conductor layer 20 when viewed in the up-down direction. With this, according to the multilayer board 10g, degradation in radiation efficiency of the patch antenna is reduced or prevented.

In the multilayer board 10g, the capacitive conductor layer 132 overlaps the first short side L3 of the radiant conductor layer 20 when viewed in the up-down direction. The capacitive conductor layer 142 overlaps the second short side L4 of the radiant conductor layer 20 when viewed in the up-down direction. With this, the capacitive conductor layer 132 has a bilaterally symmetrical structure with respect to the capacitive conductor layer 142. In the multilayer board 10g provided with the capacitive conductor layers 132 and 142, compared with a multilayer board provided only with the capacitive conductor layer 132, a portion with a large current value in the radiant conductor layer 20 and the capacitive conductor layers 132 and 142 do not have to be opposed. Thus, degradation in radiation efficiency of the patch antenna is reduced or prevented. Furthermore, the radiation characteristics of the patch antenna become bilaterally symmetrical.

Modification 8

Figure 12:
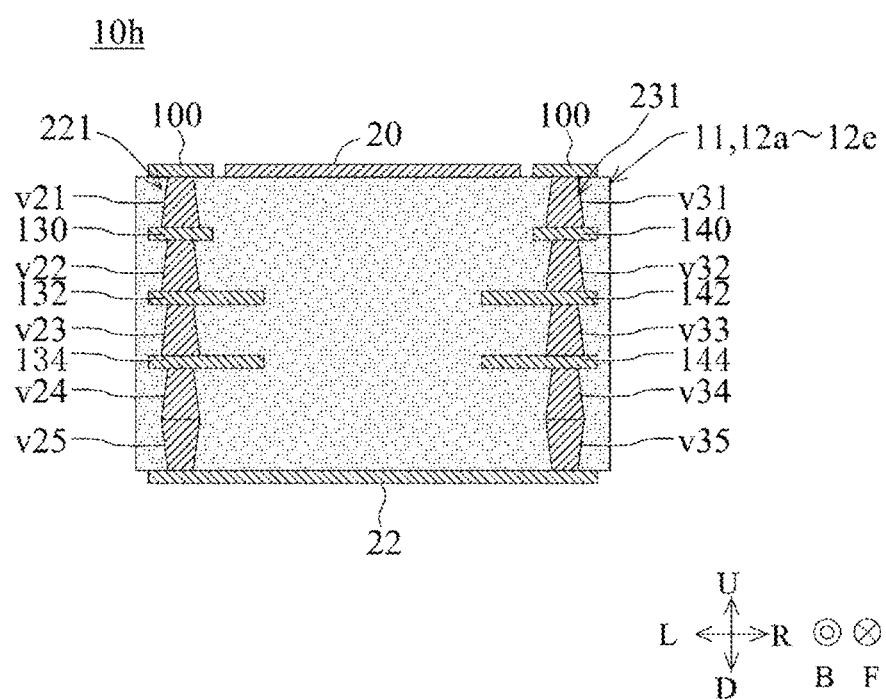
FIG. 12 is a sectional view of a multilayer board 10h according to Modification 8.

A multilayer board 10h according to Modification 8 is described below with reference to the drawings. FIG. 12 is a sectional view of the multilayer board 10h according to Modification 8.

The multilayer board 10h is different from the multilayer board 10g in the shapes of the capacitive conductor layers 134 and 144. The multilayer board 10h is described below mainly on this difference.

The first capacitance defining portion 221 includes the capacitive conductor layer 134 (second capacitive conductor layer) electrically connected to the first interlayer connection conductors v23 and v24 and provided above the ground conductor 22 and below the capacitive conductor layer 132. The capacitive conductor layer 134 overlaps the radiant conductor layer 20 when viewed in the up-down direction. In the present preferred embodiment, the capacitive conductor layer 134 overlaps the first short side L3 of the radiant conductor layer 20 when viewed in the up-down direction. The capacitive conductor layers 134 and 144 overlap the capacitive conductor layers 132 and 142, respectively, when viewed in the up-down direction.

The third capacitance defining portion 231 includes the capacitive conductor layer 144 (fourth capacitive conductor layer) electrically connected to the third interlayer connection conductors v33 and v34 and provided above the ground conductor 22 and below the capacitive conductor layer 142. The capacitive conductor layer 144 overlaps the radiant conductor layer 20 when viewed in the up-down direction. In the present preferred embodiment, the capacitive conductor layer 144 overlaps the second short side L4 of the radiant conductor layer 20 when viewed in the up-down direction.

According to the multilayer board 10h, the resonant frequency of the patch antenna can be decreased because of the same reason as that for the multilayer board 10g. According to the multilayer board 10h, an increase in loss in the patch antenna can be reduced or prevented because of the same reason as that for the multilayer board 10g. According to the multilayer board 10h, directivity of the patch antenna can be improved because of the same reason as that for the multilayer board 10g. According to the multilayer board 10h, because of the same reason as that for the multilayer board 10g, when the multilayer board 10h includes a plurality of patch antennas, isolation among the plurality of patch antennas increases. According to the multilayer board 10h, degradation in radiation efficiency of the patch antenna is reduced or prevented because of the same reason as that for the multilayer board 10g. According to the multilayer board 10h, the radiation characteristics of the patch antenna become bilaterally symmetrical because of the reason as that for the multilayer board 10g.

According to the multilayer board 10h, without increasing the area where the capacitive conductor layers 132 and 142 face the radiant conductor layer 20, the capacitance between the radiant conductor layer 20 and the ground conductor 22 can be increased by using the capacitance between the capacitive conductor layers 134 and 144 and the radiant conductor layer 20. With this, the capacitive conductor layers 132, 134, 142, and 144 do not have to be opposed in a portion with a large current value in the radiant conductor layer 20. Thus, degradation in radiation efficiency of the patch antenna can be reduced or prevented.

The resonant frequency of the patch antenna can be decreased also because of the following reason. More specifically, the capacitive conductor layer 144 overlaps the first short side L3 of the radiant conductor layer 20 when viewed in the up-down direction. The capacitive conductor layer 144 overlaps the second short side L4 of the radiant conductor layer 20 when viewed in the up-down direction. With this, the capacitance generated between the radiant conductor layer 20 and the ground conductor 22 further increases. As a result, according to the multilayer board 10h, the resonant frequency of the patch antenna is decreased.

Modification 9

A multilayer board 10i according to Modification 9 is described below with reference to the drawings. FIG. 13 is a top view of the multilayer board 10i according to Modification 9.

The multilayer board 10i is different from the multilayer board 10g in further including capacitive conductor layers 234 and 244. The multilayer board 10i is described below mainly on this difference.

As with the capacitive conductor layer 132 and the capacitive conductor layer 142, the capacitive conductor layers 234 and 244 are electrically connected to the ground conductor 22 and the frame-shaped conductor layer 100. The capacitive conductor layer 234 overlaps the first long side L1 of the radiant conductor layer 20 when viewed in the up-down direction. The capacitive conductor layer 244 overlaps the second long side L2 of the radiant conductor layer 20 when viewed in the up-down direction.

According to the multilayer board 10i, the resonant frequency of the patch antenna can be decreased because of the same reason as that for the multilayer board 10g. According to the multilayer board 10i, an increase in loss in the patch antenna can be reduced or prevented because of the same reason as that for the multilayer board 10g. According to the multilayer board 10i, directivity of the patch antenna can be improved because of the same reason as that for the multilayer board 10g. According to the multilayer board 10i, because of the same reason as that for the multilayer board 10g, when the multilayer board 10i includes a plurality of patch antennas, isolation among the plurality of patch antennas increases. According to the multilayer board 10i, degradation in radiation efficiency of the patch antenna is reduced or prevented because of the same reason as that for the multilayer board 10g. According to the multilayer board 10*i*, the radiation characteristics of the patch antenna become bilaterally symmetrical because of the reason as that for the multilayer board 10*g*.

According to the multilayer board 10*i*, when the patch antenna has resonant frequencies of two types, the resonant frequencies of two types can be decreased. More specifically, in the radiant conductor layer 20, a standing wave occurs in which the length between the first short side L3 and the second short side L4 is an integral multiple of a substantially half wave, and a standing wave occurs in which the length between the first long side L1 and the second long side L2 is an integral multiple of a substantially half wave. Therefore, the patch antenna may have two resonant frequencies. Hence, the capacitive conductor layer 132 overlaps the first short side L3 of the radiant conductor layer 20 when viewed in the up-down direction. The capacitive conductor layer 142 overlaps the second short side L4 of the radiant conductor layer 20 when viewed in the up-down direction. With this, the resonant frequency of the standing wave occurring between the first short side L3 and the second short side L4 decreases. Also, the capacitive conductor layer 234 overlaps the first long side L1 of the radiant conductor layer 20 when viewed in the up-down direction. The capacitive conductor layer 244 overlaps the second long side L2 of the radiant conductor layer 20 when viewed in the up-down direction. With this, the resonant frequency of the standing wave occurring between the first long side L1 and the second long side L2 decreases.

Modification 10

A multilayer board 10*j* according to Modification 10 is described below with reference to the drawings. FIG. 14 depicts sectional views and a top view of the multilayer board 10*j* according to Modification 10. In FIG. 14, sectional views at positions corresponding to D-D, E-E, and F-F of FIG. 14 are depicted.

The multilayer board 10*j* has the same structure as that of the multilayer board 10*g* in D-D and F-F sections, and has the same structure as that of the multilayer board 10*e* in E-E section.

According to the multilayer board 10*j*, the resonant frequency of the patch antenna can be decreased because of the same reason as that for the multilayer board 10*e*. According to the multilayer board 10*j*, an increase in loss in the patch antenna can be reduced or prevented because of the same reason as that for the multilayer board 10*e*. According to the multilayer board 10*j*, directivity of the patch antenna can be improved because of the same reason as that for the multilayer board 10*e*. According to the multilayer board 10*j*, because of the same reason as that for the multilayer board 10*e*, when the multilayer board 10*j* includes a plurality of patch antennas, isolation among the plurality of patch antennas increases. According to the multilayer board 10*j*, degradation in radiation efficiency of the patch antenna is reduced or prevented because of the same reason as that for the multilayer board 10*g*. According to the multilayer board 10*j*, the radiation characteristics of the patch antenna become bilaterally symmetrical because of the same reason as that for the multilayer board 10*g*.

Other Preferred Embodiments

The multilayer boards according to preferred embodiments of the present invention is not limited to the multilayer boards 10 and 10*a* to 10*j* according to the preferred embodiments described above, and can be changed in the scope of the gist of the present invention.

Note that the structures of the multilayer boards 10 and 10*a* to 10*j* may be combined in any manner.

Note that in the multilayer boards 10 and 10*a* to 10*j*, an insulator layer (resist film) covering the radiant conductor layers 20*a* to 20*c* and 20 may further be provided on the upper surface of the insulator layer 12*a*. Similarly, in the multilayer boards 10 and 10*a* to 10*j*, an insulator layer (resist film) covering the ground conductor 22 may further be provided on the lower surface of the insulator layers 12*d* and 12*e*.

Note that the multilayer boards 10 and 10*a* to 10*j* do not have to include a plurality of patch antennas.

Note that in the multilayer boards 10 and 10*a* to 10*d*, the first interlayer connection conductors via to v8*a* may be electrically connected to the ground conductor 22. The plurality of first interlayer connection conductors via to v8*a* are not electrically connected to the radiant conductor layer 20*a*. When the first interlayer connection conductors via to v8*a* are electrically connected to the ground conductor 22, a distance from the upper end of the first interlayer connection conductors via to v8*a* to the radiant conductor layer 20*a* in the up-down direction is shorter than a distance from the radiant conductor layer 20*a* to the ground conductor 22 in the up-down direction.

Note that in the multilayer boards 10 and 10*a* to 10*d*, the first interlayer connection conductors via to v8*a* may be electrically connected to a portion other than the outer edge portion of the radiant conductor layer 20*a*.

Note that in the multilayer boards 10 and 10*a* to 10*j*, the radiant conductor layer 20*a* does not have to be provided with the slits SL1*a* to SL4*a*.

Note that in the multilayer boards 10 and 10*a* to 10*j*, the element assembly 11 does not have to have flexibility. Also, the element assembly 11 may be folded, or does not have to be folded.

Note that in the multilayer board 10*c*, the first interlayer connection conductor v2*a* overlaps the first interlayer connection conductor v6*a* when viewed in the up-down direction. However, the first interlayer connection conductor v2*a* does not have to overlap the first interlayer connection conductor v6*a* when viewed in the up-down direction.

Note that in the multilayer boards 10*g* to 10*i*, the capacitive conductor layers 132 and 134 may overlap a portion other than the first short side L3 of the radiant conductor layer 20 when viewed in the up-down direction. The capacitive conductor layer 142 and the capacitive conductor layer 144 may overlap a portion other than the second short side L4 of the radiant conductor layer 20 when viewed in the up-down direction. The capacitive conductor layer 234 may overlap a portion other than the first long side L1 of the radiant conductor layer 20 when viewed in the up-down direction. The capacitive conductor layer 244 may overlap a portion other than the second long side L2 of the radiant conductor layer 20 when viewed in the up-down direction.

Note that in the multilayer boards 10*g* to 10*i*, the radiant conductor layer 20 does not have to have a rectangular shape when viewed in the up-down direction. The radiant conductor layer 20 may have a polygonal shape that is pentagonal or more. When the radiant conductor layer 20 has a hexagonal shape, the patch antenna can have resonant frequencies of three types. In this case, the capacitive conductor layers may overlap each of the six sides of the radiant conductor layer 20.

Note that in the multilayer board 10*i*, the capacitive conductor layer 132, the capacitive conductor layer 142, and the capacitive conductor layers 232 and 234 may be connected as one. In this case, a conductor layer including the capacitive conductor layer 132, the capacitive conductor layer 142, and the capacitive conductor layers 232 and 234 has a frame shape. The conductor layer including the capacitive conductor layer 132, the capacitive conductor layer 142, and the capacitive conductor layers 232 and 234 overlaps the entire first long side L1, the entire second long side L2, the entire first short side L3, and the entire second short side L4 of the radiant conductor layer 20 when viewed in the up-down direction.

Note that in the multilayer board 10g, the capacitive conductor layer 132 does not overlap both ends of the first short side L3. With this, even if the capacitive conductor layer 132 is shifted in the front-back direction with respect to the radiant conductor layer 20, the capacitance occurring between the capacitive conductor layer 132 and the radiant conductor layer 20 does not change. Because of the same reason, even if the capacitive conductor layer 142 is shifted in the front-back direction with respect to the radiant conductor layer 20, the capacitance occurring between the capacitive conductor layer 142 and the radiant conductor layer 20 does not change. However, the capacitive conductor layer 132 may overlap both ends of the first short side L3. In this case, both ends of the capacitive conductor layer 132 in the front-back direction may match both ends of the first short side L3 or do not have to match them. Similarly, the capacitive conductor layer 142 may overlap both ends of the second short side L4. In this case, both ends of the capacitive conductor layer 142 in the front-back direction may match both ends of the second short side L4 or do not have to match them.

Note that the downward direction may be the first direction and the upward direction may be the second direction. That is, it is only required that one of the upward direction and the downward direction be the first direction and the other of the upward direction and the downward direction be the second direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
    an element assembly;
    a radiant conductor layer; and
    a first capacitance defining portion; wherein
    the element assembly includes a structure in which a plurality of insulator layers including a first insulator layer and a second insulator layer are laminated in an up-down direction;
    one of an upward direction and a downward direction is defined as a first direction and another one of the upward direction and the downward direction is defined as a second direction;
    the first insulator layer is arranged in the first direction of the second insulator layer;
    the radiant conductor layer is provided on an upper surface or a lower surface of the first insulator layer;
    the first capacitance defining portion includes a first interlayer connection conductor extending through one or more insulator layers among the plurality of insulator layers in the up-down direction;
    the first interlayer connection conductor is electrically connected to the radiant conductor layer;
    a ground conductor is arranged in the second direction of the radiant conductor layer;
    the radiant conductor layer, the ground conductor, and the first capacitance defining portion define and function as a patch antenna;
    a distance from an end of the first interlayer connection conductor in the second direction to the ground conductor in the up-down direction is shorter than a distance from the radiant conductor layer to the ground conductor in the up-down direction; and
    the multilayer board includes a structure (A) or (B):
    (A) the multilayer board further includes the ground conductor provided on an upper surface or a lower surface of the second insulator layer so as to overlap the radiant conductor layer when viewed in the up-down direction, the ground conductor being not electrically connected to the radiant conductor layer; and
    (B) the ground conductor is provided outside the multilayer board so as to overlap the radiant conductor layer when viewed in the up-down direction.

2. The multilayer board according to claim 1, wherein the first interlayer connection conductor is electrically connected to an outer edge portion of the radiant conductor layer.

3. The multilayer board according to claim 1, wherein a slit extending from an outer edge of the radiant conductor layer toward inside of the radiant conductor layer when viewed in the up-down direction is provided to the radiant conductor layer.

4. The multilayer board according to claim 1, wherein the element assembly has flexibility and is folded.

5. The multilayer board according to claim 1, wherein
    the multilayer board further includes a frame-shaped conductor layer;
    the frame-shaped conductor layer is provided, together with the radiant conductor layer, on the upper surface or lower surface of the first insulator layer;
    the frame-shaped conductor layer has a frame shape surrounding the radiant conductor layer when viewed in the up-down direction; and
    the frame-shaped conductor layer is electrically connected to the ground conductor.

6. The multilayer board according to claim 5, wherein
    the multilayer board includes the structure (A); and
    the first interlayer connection conductor is electrically connected to the ground conductor and the frame-shaped conductor layer.

7. The multilayer board according to claim 6, wherein
    the first interlayer connection conductor does not overlap the radiant conductor layer when viewed in the up-down direction;
    the first capacitance defining portion further includes a first capacitive conductor layer electrically connected to the first interlayer connection conductor and provided in the first direction with respect to the ground conductor and in the second direction with respect to the radiant conductor layer; and
    the first capacitive conductor layer overlaps the radiant conductor layer when viewed in the up-down direction.

8. The multilayer board according to claim 7, wherein
    the radiant conductor layer has a rectangular shape including a first long side, a second long side, a first short side, and a second short side when viewed in the up-down direction; and
    the first capacitive conductor layer overlaps the first short side of the radiant conductor layer when viewed in the up-down direction.

9. The multilayer board according to claim 8, wherein
the multilayer board includes a third capacitance defining portion;
the third capacitance defining portion includes a plurality of third interlayer connection conductors traversing one or more insulator layer among the plurality of insulator layers in the up-down direction and a third capacitive conductor layer electrically connected to the third interlayer connection conductor and provided in the first direction with respect to the ground conductor and in the second direction with respect to the radiant conductor layer;
the third interlayer connection conductors are electrically connected to the ground conductor and the frame-shaped conductor layer; and
the third capacitive conductor layer overlaps the second short side of the radiant conductor layer when viewed in the up-down direction.

10. The multilayer board according to claim 7, wherein
the first capacitance defining portion further includes a second capacitive conductor layer electrically connected to the first interlayer connection conductor and provided in the first direction with respect to the ground conductor and in the second direction with respect to the first capacitive conductor layer; and
the second capacitive conductor layer overlaps the radiant conductor layer when viewed in the up-down direction.

11. The multilayer board according to claim 5, wherein
the multilayer board includes a fourth capacitance defining portion;
the fourth capacitance defining portion includes a fourth interlayer connection conductor traversing one or more insulator layer among the plurality of insulator layers in the up-down direction;
the fourth interlayer connection conductor is electrically connected to the radiant conductor layer; and
a distance from an end of the fourth interlayer connection conductor in the second direction to the ground conductor in the up-down direction is shorter than a distance from the radiant conductor layer to the ground conductor in the up-down direction.

12. The multilayer board according to claim 1, wherein
the multilayer board includes a plurality of sets of the radiant conductor layer, the ground conductor, and the first capacitance defining portion which define and function as the patch antenna.

13. The multilayer board according to claim 12, wherein
the multilayer board further includes a plurality of signal lines electrically connected to a plurality of the radiant conductor layers, respectively; and
the plurality of signal lines have a substantially equal length.

14. The multilayer board according to claim 1, wherein
the multilayer board includes a second capacitance defining portion;
the first capacitance defining portion includes a plurality of the first interlayer connection conductors;
the plurality of first interlayer connection conductors are electrically connected to the radiant conductor layer;
the second capacitance defining portion includes a plurality of second interlayer connection conductors traversing one or more insulator layer among the plurality of insulator layers in the up-down direction;
the plurality of second interlayer connection conductors are electrically connected to the ground conductor; and
when viewed in a direction orthogonal to the up-down direction, the plurality of first interlayer connection conductors and the plurality of second interlayer connection conductors are alternately aligned.

15. A multilayer board comprising:
an element assembly;
a radiant conductor layer; and
a first capacitance defining portion; wherein
the element assembly has a structure in which a plurality of insulator layers including a first insulator layer and a second insulator layer are laminated in an up-down direction;
one of an upward direction and a downward direction is defined as a first direction and another one of the upward direction and the downward direction is defined as a second direction;
the first insulator layer is arranged in the first direction of the second insulator layer;
the radiant conductor layer is provided on an upper surface or a lower surface of the first insulator layer;
the first capacitance defining portion includes a first interlayer connection conductor extending through one or more insulator layer among the plurality of insulator layers in the up-down direction;
the first interlayer connection conductor is electrically connected to a ground conductor arranged in the second direction of the radiant conductor layer;
the radiant conductor layer, the ground conductor, and the first capacitance defining portion define and function as a patch antenna;
a distance from an end of the first interlayer connection conductor in the first direction to the ground conductor in the up-down direction is shorter than a distance from the radiant conductor layer to the ground conductor in the up-down direction; and
the multilayer board includes a structure (A) or (B):
(A) the multilayer board further includes the ground conductor provided on an upper surface or a lower surface of the second insulator layer so as to overlap the radiant conductor layer when viewed in the up-down direction, the ground conductor being not electrically connected to the radiant conductor layer; and
(B) the ground conductor is provided outside the multilayer board so as to overlap the radiant conductor layer when viewed in the up-down direction.

16. The multilayer board according to claim 15, wherein
the first interlayer connection conductor is electrically connected to an outer edge portion of the radiant conductor layer.

17. The multilayer board according to claim 15, wherein
a slit extending from an outer edge of the radiant conductor layer toward inside of the radiant conductor layer when viewed in the up-down direction is provided to the radiant conductor layer.

18. The multilayer board according to claim 15, wherein
the element assembly has flexibility and is folded.

19. The multilayer board according to claim 15, wherein
the multilayer board further includes a frame-shaped conductor layer;
the frame-shaped conductor layer is provided, together with the radiant conductor layer, on the upper surface or lower surface of the first insulator layer;
the frame-shaped conductor layer has a frame shape surrounding the radiant conductor layer when viewed in the up-down direction; and
the frame-shaped conductor layer is electrically connected to the ground conductor.

20. The multilayer board according to claim 19, wherein
the multilayer board includes the structure (A); and
the first interlayer connection conductor is electrically connected to the ground conductor and the frame-shaped conductor layer.

* * * * *